(12) United States Patent
Jang

(10) Patent No.: US 11,924,008 B2
(45) Date of Patent: Mar. 5, 2024

(54) COMPENSATION CIRCUIT FOR ADJUSTING RATIO OF COINCIDENCE COUNTS OF DATA PATTERNS, AND MEMORY DEVICE INCLUDING THE SAME, AND OPERATING METHOD THEREOF

(71) Applicant: Samsung Electronics Co., Ltd., Suwon-si (KR)

(72) Inventor: Wonsuk Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 17/866,933

(22) Filed: Jul. 18, 2022

(65) Prior Publication Data

US 2023/0145624 A1 May 11, 2023

(30) Foreign Application Priority Data

Nov. 5, 2021 (KR) .................. 10-2021-0151080

(51) Int. Cl.
*H04L 25/03* (2006.01)
*G06F 11/07* (2006.01)

(52) U.S. Cl.
CPC ...... *H04L 25/03885* (2013.01); *G06F 11/076* (2013.01); *H04L 25/03312* (2013.01)

(58) Field of Classification Search
CPC ......... H04L 25/03885; H04L 25/03312; H04L 25/069; H04L 25/03057; H04L 25/03006; G06F 11/076; H03M 13/01; G11C 7/1048

USPC ..................................... 375/232, 354, 365
See application file for complete search history.

(56) References Cited

U.S. PATENT DOCUMENTS

| | | | |
|---|---|---|---|
| 8,548,038 B2 | 10/2013 | Sindalovsky et al. | |
| 8,669,930 B2 * | 3/2014 | Kim .................... | H04N 19/503 345/98 |
| 8,879,618 B2 | 11/2014 | Abdalla et al. | |
| 8,908,754 B1 | 12/2014 | Qian et al. | |
| 8,953,665 B2 | 2/2015 | Sindalovsky et al. | |

(Continued)

FOREIGN PATENT DOCUMENTS

| | | |
|---|---|---|
| JP | 2011151765 A | 8/2011 |
| KR | 102134659 B1 | 7/2020 |

*Primary Examiner* — Emmanuel Bayard
(74) *Attorney, Agent, or Firm* — Muir Patent Law, PLLC

(57) ABSTRACT

Disclosed is a compensation circuit which includes a data analyzer that receives a first bit stream including first to N-th bits, counts a number of times of coincidence of each of first to $2^M$-th patterns each having an M-bit size from the first bit stream, and generates a first pattern stream including first to $2^M$-th count values each corresponding to the number of times of coincidence of each of the first to $2^M$-th patterns, and a compensation calculator that determines first to $2^M$-th compensation values based on the first pattern stream such that results of multiplying the first to $2^M$-th count values and the first to $2^M$-th compensation values one-to-one are even. "N" is a natural number, and "M" is a natural number smaller than "N".

20 Claims, 13 Drawing Sheets

(56) References Cited

U.S. PATENT DOCUMENTS

| | | | |
|---|---|---|---|
| 9,521,021 B2 | 12/2016 | He et al. | |
| 9,813,188 B2 | 11/2017 | Ogata et al. | |
| 10,887,030 B2 | 1/2021 | Simpson | |
| 2003/0065991 A1* | 4/2003 | Abramovitch | G01R 31/3171 |
| | | | 714/704 |
| 2006/0008279 A1* | 1/2006 | Chiang | H04B 10/6971 |
| | | | 398/202 |
| 2009/0304054 A1* | 12/2009 | Tonietto | H04L 25/03343 |
| | | | 375/221 |
| 2017/0206133 A1* | 7/2017 | Haneda | G06F 11/1004 |

* cited by examiner

FIG. 10

| Bit Number | 1 | 2 | ... | N-1 | N | N+1 | N+2 | ... | 2N-1 | 2N |
|---|---|---|---|---|---|---|---|---|---|---|
| Bit Value | 1 | 1 | ... | 1 | 0 | 1 | 1 | ... | 1 | 1 |

BS1 covers bits 1 to N; BS (Previous) covers bits N+1 to 2N.

PT2: 0 1

COMPENSATION CIRCUIT FOR ADJUSTING RATIO OF COINCIDENCE COUNTS OF DATA PATTERNS, AND MEMORY DEVICE INCLUDING THE SAME, AND OPERATING METHOD THEREOF

CROSS-REFERENCE TO RELATED APPLICATIONS

This application claims priority under 35 U.S.C. § 119 to Korean Patent Application No. 10-2021-0151080 filed on Nov. 5, 2021, in the Korean Intellectual Property Office, the disclosures of which are incorporated by reference herein in their entireties.

BACKGROUND

Embodiments of the present disclosure described herein relate to a compensation circuit, and more particularly, relate to a compensation circuit for adjusting a ratio of coincidence counts of data patterns.

An electronic device exchanges information with another electronic device by transmitting and receiving an electrical signal to and from another electronic device over a channel (e.g., a signal line). Signals that are exchanged between the electronic devices may be distorted by a response characteristic of the channel. Various types of equalizers are used to compensate for the signal distortion.

As an example, to compensate for the signal distortion, a decision feedback equalizer (DFE) is implemented at a receiving part of an electronic device. However, in the case where a ratio of data patterns in a bit stream is not even, that is, in the case where the ratio is biased to any one data pattern, the decision feedback equalizer may fail to operate normally. Also, an error caused by an abnormal operation of the decision feedback equalizer affects data received later, thereby causing a consecutive error.

SUMMARY

Embodiments of the present disclosure provide a compensation circuit for adjusting a ratio of coincidence counts of data patterns, a memory device including the same, and an operating method thereof.

According to an embodiment, a compensation circuit includes a data analyzer configured to receive a first bit stream including first to N-th bits, count a number of times of coincidence of each of first to $2^M$-th patterns from the first bit stream, a size of each pattern of the first to 2M-th patterns being M bits, and generate a first pattern stream including first to $2^M$-th count values, each count value of the first to $2^M$-th count values corresponding to a number of times of coincidence of a corresponding pattern of the first to $2^M$-th patterns, and a compensation calculator configured to determine first to $2^M$-th compensation values based on the first pattern stream such that results of multiplying the first to $2^M$-th count values by the first to $2^M$-th compensation values, respectively, are even. "N" is a natural number, and "M" is a natural number smaller than "N".

According to an embodiment, an equalizer circuit includes a decision feedback equalizer (DFE) configured to receive a received signal from the outside and to output an equalization signal by removing an intersymbol interference (ISI) from the received signal based on DFE coefficients, a deserializer configured to generate a bit stream including first to N-th bits and an error bit stream including first to N-th bits based on the equalization signal, a flip-flop configured to adjust an output timing of each of the first to N-th bits of the error bit stream, a compensation circuit configured to generate a compensation stream including first to $2^M$-th compensation values based on the bit stream, and a DFE coefficient calculator configured to generate the DFE coefficients based on the compensation stream and the bit stream from the compensation circuit and the error bit stream from the flip-flop and to output the DFE coefficients to the DFE. The compensation circuit includes a data analyzer configured to count a number of times of coincidence of each of first to $2^M$-th patterns from the bit stream, a size of each pattern of the first to $2^M$-th patterns being M bits, and generate a pattern stream including first to $2^M$ count values, each count value of the first to $2^M$-th count values corresponding to a result of counting a number of times of coincidence of a corresponding pattern of the first to $2^M$-th patterns, a pattern table configured to store the pattern stream, and a compensation calculator configured to determine the first to $2^M$-th compensation values based on the pattern stream from the data analyzer such that results of multiplying the first to $2^M$-th count values by the first to $2^M$-th compensation values, respectively, are even. "N" is a natural number, and "M" is a natural number smaller than "N".

According to an embodiment, an operating method of a compensation circuit includes receiving a first bit stream including first to N-th bits, counting a number of times of coincidence of each of first to $2^M$-th patterns from the first bit stream, a size of each pattern of the first to $2^M$-th patterns being M bits, generating a first pattern stream including first to $2^M$-th count values, each count value of the first to $2^M$-th count values corresponding to a result of counting a number of times of coincidence of a corresponding pattern of the first to $2^M$-th patterns, and determining first to $2^M$-th compensation values based on the first pattern stream such that results of multiplying the first to $2^M$-th count values by the first to $2^M$-th compensation values, respectively, are even. "N" is a natural number, and "M" is a natural number smaller than "N".

BRIEF DESCRIPTION OF THE FIGURES

The above and other objects and features of the present disclosure will become apparent by describing in detail embodiments thereof with reference to the accompanying drawings.

FIG. 10 is a diagram describing an operation of a data analyzer of FIG. 6 according to an embodiment of the present disclosure.

DETAILED DESCRIPTION

Below, embodiments of the present disclosure will be described in detail and clearly to such an extent that one skilled in the art easily carries out the present disclosure. With regard to the description of the present disclosure, to make the overall understanding easy, like components will be marked by like reference signs/numerals in drawings, and thus, additional description will be omitted to avoid redundancy.

Figure 1:
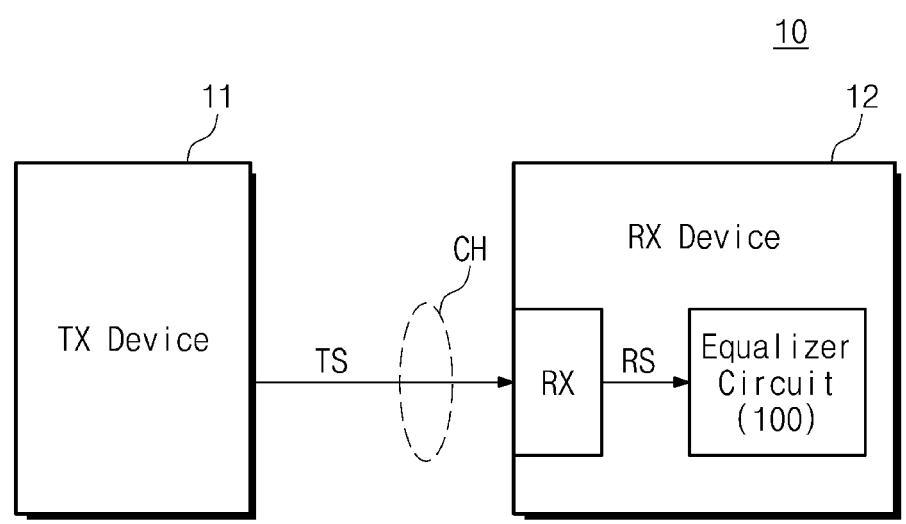
FIG. 1 is a block diagram of an electronic system according to an embodiment of the present disclosure.

FIG. 1 is a block diagram of an electronic system according to an embodiment of the present disclosure. Referring to FIG. 1, an electronic system 10 may include a transmitting device 11 and a receiving device 12. The transmitting device 11 may transmit a transmit signal TS to the receiving device 12 over a channel CH.

The receiving device 12 may include a receiving driver RX and an equalizer circuit 100. The receiving driver RX may receive the transmit signal TS from the transmitting device 11 over the channel CH and may output a received signal RS. The transmit signal TS may be distorted due to a response characteristic of the channel CH while the transmit signal TS is transferred over the channel CH. That is, the receiving driver RX may receive the transmit signal TS distorted by the channel CH and a noise and may output the received signal RS. In other words, the received signal RS may be a signal in which the response characteristic of the channel CH is applied to the transmit signal TS.

The equalizer circuit 100 may compensate for the signal distortion of the received signal RS by removing an intersymbol interference (ISI) of the received signal RS. As the equalizer circuit 100 compensates for the signal distortion of the received signal RS, the receiving device 12 may operate based on a signal that is not distorted (or a distortion-free signal).

In an embodiment, each of the transmitting device 11 and the receiving device 12 may be implemented in the form of a portable communication terminal, a personal digital assistant (PDA), a portable multimedia player (PMP), a smartphone, or a wearable device or in the form of a computing device such as a personal computer, a server, a workstation, and a notebook computer. In an embodiment, each of the transmitting device 11 and the receiving device 12 may be one of various hardware components, which are included in one user device, such as a processor, a memory device, a storage device, and a control device.

Figure 2A:
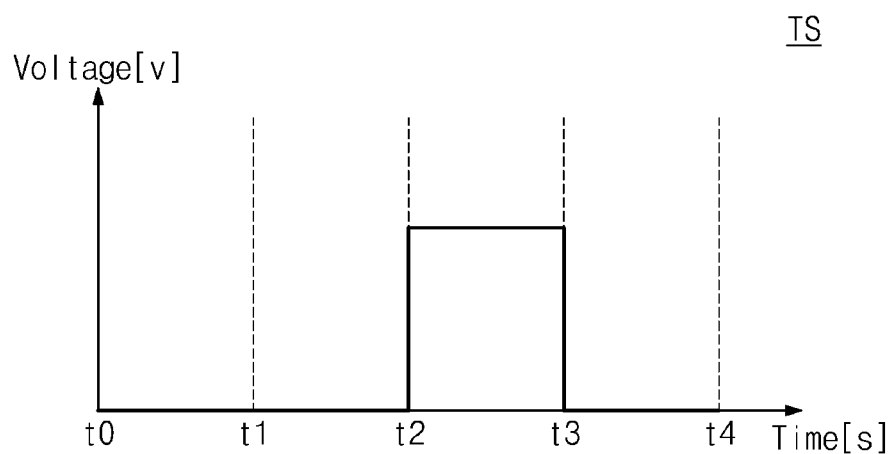
FIG. 2A is a graph illustrating a transmit signal of FIG. 1.

FIG. 2A is a graph illustrating a transmit signal of FIG. 1. Referring to FIGS. 1 and 2A, the transmit signal TS that the transmitting device 11 transmits to the receiving device 12 is illustrated. In FIG. 2A, a horizontal axis represents a time, and a vertical axis represents a voltage.

In an embodiment, the transmit signal TS may have a voltage corresponding to a logic low level from t0 to t1, may have the voltage corresponding to the logic low level from t1 to t2, may have a voltage corresponding to a logic high level from t2 to t3, and may have the voltage corresponding to the logic low level from t3 to t4.

Figure 2B:
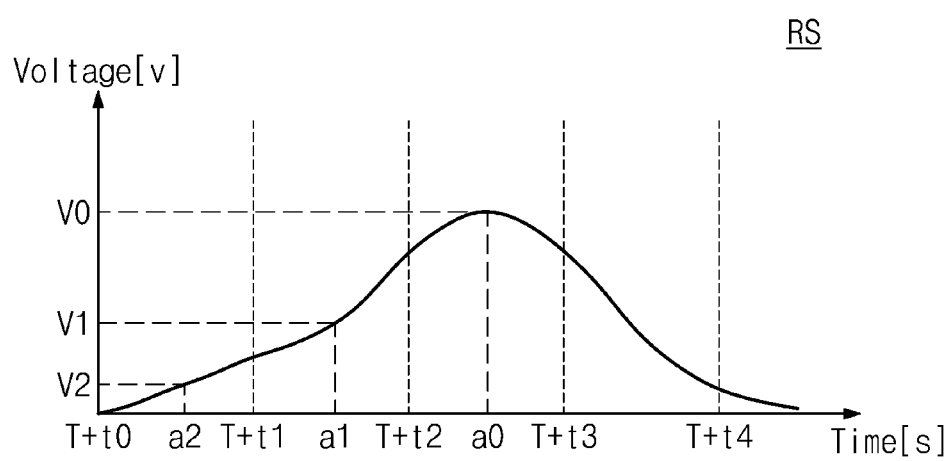
FIG. 2B is a graph illustrating a received signal of FIG. 1.

FIG. 2B is a graph illustrating a received signal of FIG. 1. Referring to FIGS. 1 and 2B, the received signal RS that the receiving device 12 receives from the transmitting device 11 is illustrated. In FIG. 2B, a horizontal axis represents a time, and a vertical axis represents a voltage.

While the transmit signal TS is transferred from the transmitting device 11 to the receiving device 12 over the channel CH, the transmit signal TS may be distorted by a characteristic of the channel CH. Also, a signal component of the transmit signal TS belonging to a time period from t0 to t1 may affect a signal component of the transmit signal TS belonging to a time period from t2 to t3, and a signal component of the transmit signal TS belonging to a time period from t1 to t2 may affect a signal component of the transmit signal TS belonging to the time period from t2 to t3. As such, a waveform of the received signal RS that the receiving driver RX outputs after a transmission time "T" may be different from a waveform of the transmit signal TS.

In an embodiment, the received signal RS may have a voltage V2 at a point in time a2 between a point in time (T+t0) and a point in time (T+t1), may have a voltage V1 at a point in time a1 between the point in time (T+t1) and a point in time (T+t2), and may have a voltage V0 at a point in time a0 between the point in time (T+t2) and a point in time (T+t3). For example, each of the points in time a2, a1, and a0 may be a point in time when the receiving device 12 measures a voltage level of the received signal RS.

In an embodiment, the point in time a0 may be referred to as a "main cursor", the point in time a1 may be referred to as a "first post cursor", and the point in time a2 may be referred to as a "second post cursor". The main cursor may correspond to a point in time when the receiving device 12 currently measures a voltage level of the received signal RS. The first post cursor and the second post cursor may lead the main cursor in time. For example, the first and second post cursors may be precede the main cursor in time.

In an embodiment, a magnitude of the voltage V0 at the point in time a0 may be referred to as a "main cursor component". A magnitude of the voltage V1 at the point in time a1 may be referred to as a "first post cursor component". A magnitude of the voltage V2 at the point in time a2 may be referred to as a "second post cursor component". The main cursor component may be affected by the first post cursor component and the second post cursor component.

In an embodiment, a cursor having a great influence on the main cursor from among the first post cursor and the second post cursor may be referred to as a "dominant cursor". For example, the first post cursor at the point in time a1 may be referred to as a "dominant cursor", based on the magnitude of the voltage V1 of the first post cursor being greater than the magnitude of the voltage V2 of the second post cursor at the point in time a2.

As described with reference to FIGS. 2A and 2B, while a signal is transferred over the channel CH, a waveform of the signal may experience unintended distortion. In the case where the transmit signal TS is distorted, incorrect data may be exchanged between the transmitting device 11 and the receiving device 12, thereby causing an error in operations of the transmitting device 11 and the receiving device 12. To prevent the above issue, the equalizer circuit 100 may remove the intersymbol interference of the received signal RS by removing the first post cursor component and the second post cursor component.

For convenience of description, the first post cursor and the second post cursor affecting the main cursor are described with reference to FIGS. 2A and 2B. Unlike the above description, three or more post cursors may affect the main cursor.

Figure 3:
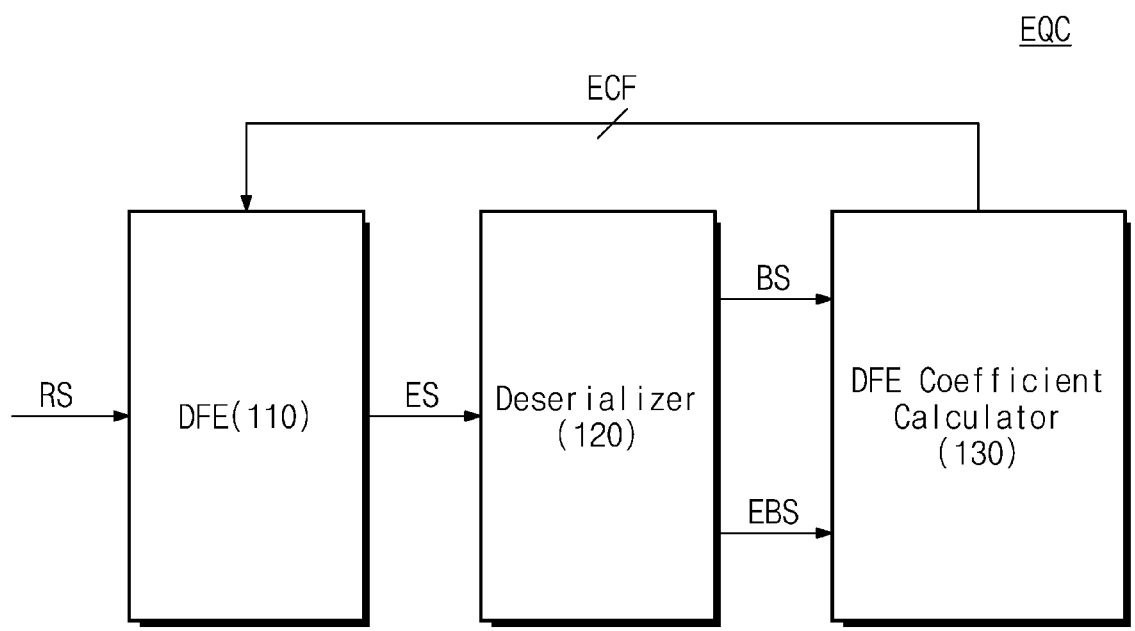
FIG. 3 is a block diagram illustrating a conventional equalizer circuit in detail.

FIG. 3 is a block diagram illustrating a conventional equalizer circuit in detail. Referring to FIG. 3, an equalizer circuit EQC may include a decision feedback equalizer (DFE) 110, a deserializer 120, and a DFE coefficient calculator 130.

The DFE 110 may be a device of non-linear equalization which relies on decisions about the levels of previous symbols (high/low) to correct the current symbol to account for distortion in the current symbol that is caused by the previous symbols. For example, to remove the first post cursor component and the second post cursor component, the equalizer circuit EQC may generate a first DFE coefficient converging on a coefficient corresponding to the first post cursor component and a second DFE coefficient converging on a coefficient corresponding to the second post cursor component. The equalizer circuit EQC may increase or decrease the first DFE coefficient through a training operation such that the first DFE coefficient converges on the coefficient corresponding to the first post cursor component. Also, the equalizer circuit EQC may increase or decrease the second DFE coefficient through the training operation such that the second DFE coefficient converges on the coefficient corresponding to the second post cursor component.

The DFE 110 may generate an equalization signal ES based on DFE coefficients ECF and the received signal RS. The DFE 110 may compensate for a distorted waveform of the received signal RS through an equalization operation. For example, the DFE 110 may remove the first post cursor component and the second post cursor component of the received signal RS based on the DFE coefficients ECF. The DFE coefficients ECF may include the first DFE coefficient and the second DFE coefficient.

In an embodiment, the DFE 110 may remove the first post cursor component and the second post cursor component based on the first DFE coefficient and the second DFE coefficient. This will be described in detail with reference to FIG. 5.

The deserializer 120 may generate a bit stream BS and an error bit stream EBS by deserializing the equalization signal ES. The bit stream BS may include information about whether a voltage level of the equalization signal ES corresponds to the logic low level or the logic high level. The bit stream BS may be a sequence of N bits and may include first to N-th bits ("N" being a natural number). For example, "N" may be "40".

The error bit stream EBS may include information about whether the voltage level of the equalization signal ES is higher than a reference voltage level or is lower than the reference voltage level. The reference voltage level may correspond to the main cursor component. The error bit stream EBS may be a sequence of N bits and may include first to N-th bits ("N" being a natural number). For example, "N" may be "40".

The DFE coefficient calculator 130 may generate the DFE coefficients ECF based on the bit stream BS and the error bit stream EBS. The DFE coefficient calculator 130 may generate the DFE coefficients ECF corresponding to post cursors affecting the main cursor.

In an embodiment, the DFE coefficient calculator 130 may perform the training operation based on a sign-sign least mean square (SS-LMS) algorithm. The DFE coefficient calculator 130 may determine whether to increase or decrease a DFE coefficient based on the bit stream BS and the error bit stream EBS.

$$C_k(i+1)=C_k(i)+\mu \cdot sgn(d(i-k)) \cdot sgn(e(i))  \quad \text{[Equation 1]}$$

Equation 1 is an SS-LMS equation that is used for the DFE coefficient calculator 130 to calculate a DFE coefficient. In Equation 1, $C_k(i+1)$ is a k-th DFE coefficient obtained through an (i+1)-th training operation, and $C_k(i)$ is the k-th DFE coefficient obtained through an i-th training operation. In Equation 1, $sgn(d(i-k))$ (hereinafter referred to as a "first function") is a function in which a result value is "1" when a logic level of a bit in the bit stream BS corresponding to a k-th post cursor is the logic high level and a result value is "−1" when the logic level of the bit in the bit stream BS corresponding to the k-th post cursor is the logic low level. In Equation 1, $sgn(e(i))$ (hereinafter referred to as a "second function") is a function in which a result value is "1" when a voltage of a bit in the error bit stream EBS corresponding to the main cursor is greater than a reference voltage and a result value is "−1" when the voltage of the bit in the error bit stream EBS corresponding to the main cursor is smaller than the reference voltage. In equation 1, $\mu$ is a step size of the iteration performed by the DFE coefficient calculator 130.

When count values of data patterns in the bit stream BS are evenly distributed, the DFE coefficient calculator 130 may perform the training operation such that each of the DFE coefficients ECF converges on a target coefficient through Equation 1. For example, the DFE coefficients ECF may converge on the target coefficient in the training operation performed based on Equation 1. The data pattern may be a unit by which the equalizer circuit EQC compensates for signal distortion. In the case where the data pattern includes 3 bits, as illustrated in FIG. 2B, the main cursor may be affected by the first post cursor and the second post cursor.

The data pattern may be composed of a set of M bits that the bit stream BS includes. In an embodiment, "M" may be a natural number, and "M" may be smaller than "N". For example, in the case where "M" is 2, the bit stream BS may have at least one of a first pattern corresponding to a pattern value of "00", a second pattern corresponding to a pattern value of "01", a third pattern corresponding to a pattern value of "10", and a fourth pattern corresponding to a pattern value of "11".

When count values of data patterns in the bit stream BS are evenly distributed, the DFE coefficient calculator 130 may perform the training operation such that each of the DFE coefficients ECF converges on a target coefficient. For example, in the case where the bit stream BS includes 10 first patterns, 10 second patterns, 10 third patterns, and 10 fourth patterns, the DFE coefficient calculator 130 may perform the training operation such that each of the DFE coefficients ECF converges on a target coefficient.

However, in the case where the count values of the data patterns in the bit stream BS are not evenly distributed, each of the DFE coefficients ECF may not converge on a target coefficient through the training operation of the DFE coefficient calculator 130. For example, in the case where the bit stream BS does not include the first pattern and the fourth pattern and includes 20 second patterns and 20 third patterns, each of the DFE coefficients ECF may not converge on a target coefficient.

For example, in the case where the main cursor is affected by the first post cursor and the second post cursor, the DFE coefficient calculator 130 may generate the first DFE coefficient and the second DFE coefficient based on Equation 1. In the case where the first DFE coefficient is smaller than the coefficient corresponding to the first post cursor component, the DFE coefficient calculator 130 may perform the training operation such that the first DFE coefficient increases, that is, such that the first DFE coefficient converges on the coefficient corresponding to the first post cursor component. The second DFE coefficient is maintained during a time when the first DFE coefficient converges on the coefficient corresponding to the first post cursor component.

The DFE coefficient calculator 130 may determine whether to increase or decrease the first DFE coefficient, depending on a first case having a pattern value of "111", a second case having a pattern value of "011", a third case having a pattern value of "101", and a fourth case having a pattern value of "001".

In the first case, in the case of the first DFE coefficient, the first function may have "1", and the second function may have "1". This means that there is a need to increase the first DFE coefficient for the purpose of converging on the coefficient corresponding to the first post cursor component. In the case of the second DFE coefficient, the first function may have "1", and the second function may have "1". This means that there is a need to increase the second DFE coefficient for the purpose of converging on the coefficient corresponding to the second post cursor component.

In the second case, in the case of the first DFE coefficient, the first function may have "1", and the second function may have "1". This means that there is a need to increase the first DFE coefficient for the purpose of converging on the coefficient corresponding to the first post cursor component. In the case of the second DFE coefficient, the first function may have "−1", and the second function may have "1". This means that there is a need to decrease the second DFE coefficient for the purpose of converging on the coefficient corresponding to the second post cursor component.

In the third case, in the case of the first DFE coefficient, the first function may have "−1", and the second function may have "−1". This means that there is a need to increase the first DFE coefficient for the purpose of converging on the coefficient corresponding to the first post cursor component. In the case of the second DFE coefficient, the first function may have "1", and the second function may have "−1". This means that there is a need to decrease the second DFE coefficient for the purpose of converging on the second post cursor component.

In the fourth case, in the case of the first DFE coefficient, the first function may have "−1", and the second function may have "−1". This means that there is a need to increase the first DFE coefficient for the purpose of converging on the coefficient corresponding to the first post cursor component. In the case of the second DFE coefficient, the first function may have "−1", and the second function may have "−1". This means that there is a need to increase the second DFE coefficient for the purpose of converging on the coefficient corresponding to the second post cursor component.

As described above, in the case where count values of the bit stream BS corresponding to the first case, the second case, the third case, and the fourth case are even, the first DFE coefficient may continue to increase, and the second DFE coefficient may be maintained. Afterwards, in the above case, the first DFE coefficient and the second DFE coefficient may increase or decrease while a value of the first function or the second function of the first DFE coefficient or the second DFE coefficient varies. As such, a voltage corresponding to the first DFE coefficient may converge on the first post cursor component, and a voltage corresponding to the second DFE coefficient may converge on the second post cursor component. However, in the case where the count values of the bit stream BS corresponding to the first case, the second case, the third case, and the fourth case are uneven, the first DFE coefficient may converge on a coefficient different in value from the coefficient corresponding to the first post cursor component, and the second DFE coefficient may converge on a coefficient different in value from the coefficient corresponding to the second post cursor component.

In the case where the first DFE coefficient converges on a coefficient different in value from the coefficient corresponding to the first post cursor component, the DFE 110 may fail to correctly remove the first post cursor component. Also, in the case where the second DFE coefficient converges on a coefficient different in value from the coefficient corresponding to the second post cursor component, the DFE 110 may fail to correctly remove the second post cursor component. As such, the equalizer circuit EQC may fail to correctly compensate for a distorted portion of a received signal. That is, to correctly compensate for the distorted portion of the received signal, there is a need to adjust uneven count values of data patterns such that the count values of the data patterns are even.

The equalizer circuit EQC may not count the number of times of coincidence of a data pattern exceeding a count threshold value within the bit stream BS, and thus, a ratio of data patterns of the bit stream BS may be adjusted. However, because the equalizer circuit EQC does not count the number of times of coincidence of the data pattern exceeding the count threshold value, a pattern(s) that is not used to generate the DFE coefficients ECF may be present in the bit stream BS. As such, the equalizer circuit EQC may wait until all data patterns corresponding to an accumulated threshold value are received. During a time when the equalizer circuit EQC is waiting for all data patterns, the DFE coefficients ECF may not converge on target coefficients or even though the DFE coefficients ECF converge on the target coefficients, a converging time may increase.

Also, in the case where the DFE 110 generates the equalization signal ES based on the DFE coefficients ECF not converging on the target coefficients and the received signal RS, data eyes may be closed in an eye pattern of the equalization signal ES. That is, it may be difficult to accurately determine data of the equalization signal ES.

Figure 4:
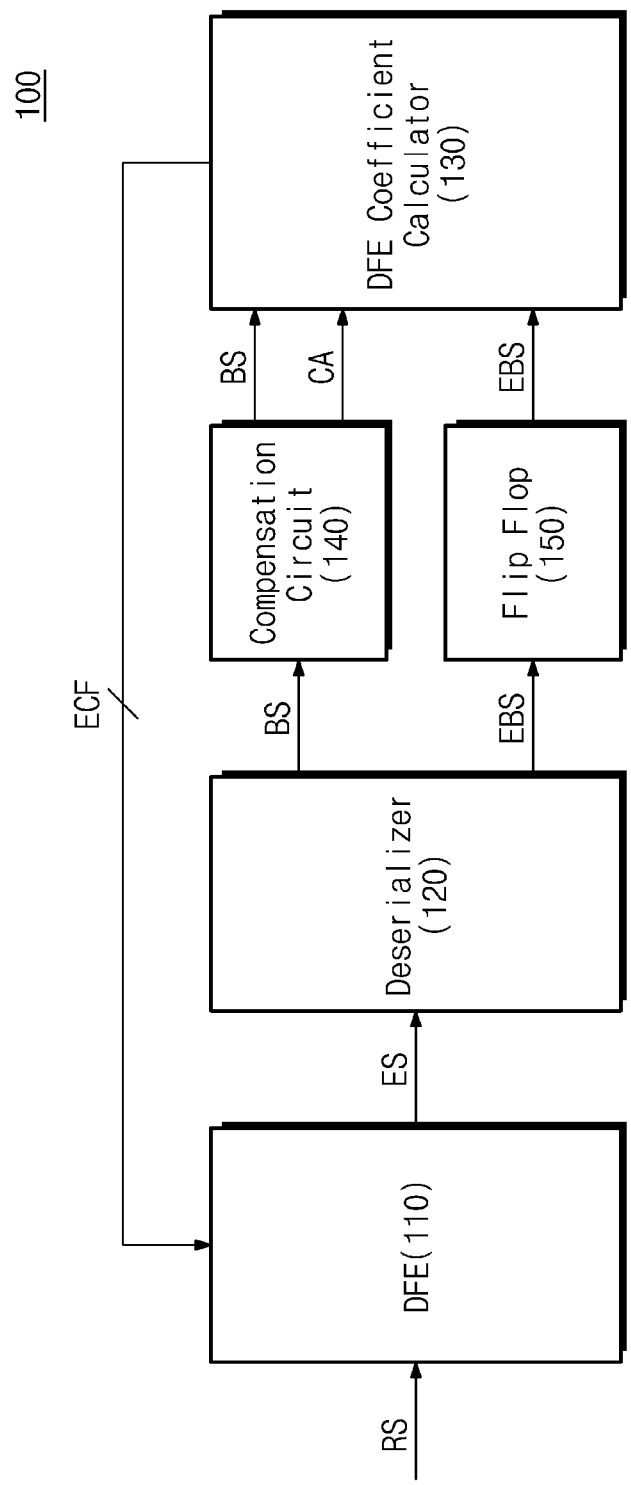
FIG. 4 is a block diagram illustrating an equalizer circuit according to an embodiment of the present disclosure in detail.

FIG. 4 is a block diagram illustrating an equalizer circuit according to an embodiment of the present disclosure in detail. Referring to FIG. 4, the equalizer circuit 100 may include the DFE 110, the deserializer 120, the DFE coefficient calculator 130, a compensation circuit 140, and a flip-flop 150. The equalizer circuit 100 may correspond to the equalizer circuit 100 of FIG. 1. The DFE 110, the deserializer 120, and the DFE coefficient calculator 130 are similar to the DFE 110, the deserializer 120, the DFE coefficient calculator 130 of FIG. 3, and thus, additional description thereof will be omitted to avoid redundancy.

The deserializer 120 may output the bit stream BS to the compensation circuit 140. In an embodiment, the deserializer 120 may output a first bit stream including first to N-th bits to the compensation circuit 140 and may output a second bit stream including (N+1)-th to 2N-th bits to the compensation circuit 140. In an embodiment, each of the first bit stream and the second bit stream has a size of N bits.

The deserializer 120 may output the error bit stream EBS to the flip-flop 150. In an embodiment, the deserializer 120 may output a first error bit stream including first to N-th bits to the flip-flop 150 and may output a second error bit stream including (N+1)-th to 2N-th bits to the flip-flop 150. In an embodiment, each of the first and second error bit streams has a size of N bits. In an embodiment, the first error bit stream may be the same as the first bit stream in size. In an embodiment, the second error bit stream may be the same as the second bit stream in size.

The compensation circuit 140 may analyze first to $2^M$-th patterns each having an M-bit size from the bit stream BS. In an embodiment, the compensation circuit 140 may count the number of times of coincidence (or detection) of each of the first to $2^M$-th patterns from the bit stream BS and may generate first to $2^M$-th count values.

The compensation circuit 140 may generate first to $2^M$-th compensation values based on the first to $2^M$-th count values. The compensation circuit 140 may generate the first to $2^M$-th compensation values such that results of (or values obtained by) multiplying the first to $2^M$-th count values by the first to $2^M$-th compensation values one-to-one are even (i.e., respectively). In an embodiment, that the results of multiplying the first to $2^M$-th count values by the first to $2^M$-th compensation values one-to-one are even may mean that the results of (or values obtained by) multiplying the first to $2^M$-th count values by the first to $2^M$-th compensation values one-to-one are equal to each other. For example, the compensation circuit 140 may operate to set the compensation values to satisfy the condition that a value of multiplying each compensation value of the first to $2^M$-th compensation values by a corresponding count value of the first to $2^M$-th values has a same value. For example, the value obtained by multiplying a first compensation value by a first count value is the same as the value obtained by multiplying a second compensation value by a second count value, and the value obtained by multiplying a $2^M$-th compensation value by a $2^M$-th count value.

The compensation circuit 140 may generate a compensation array CA including first to N-th indexes based on the first to $2^M$-th compensation values. Each of the first to N-th indexes of the compensation array CA may have one of the first to $2^M$-th compensation values. In an embodiment, the compensation array CA may store first to $2^M$-th compensation values as array elements. Each array element of the compensation array CA may store a corresponding compensation value of the first to $2^M$-th compensation values, and may be identified using a corresponding index. When the compensation array CA is one-dimensional array structure, the index may increase from one (1) to $2^M$. In an embodiment, the compensation array CA may have a two-dimensional array structure. The compensation circuit 140 will be described in detail with reference to FIG. 6.

The flip-flop 150 may receive the error bit stream EBS from the deserializer 120 and may output the received error bit stream EBS to the DFE coefficient calculator 130. The flip-flop 150 may adjust output timing of each of the first to N-th bits of the error bit stream EBS such that output timing of each of the first to N-th bits of the error bit stream EBS is the same as output timing of each of the first to N-th bits of the bit stream BS. For example, the flip-flop 150 may be implemented with a plurality of flip-flops connected in series.

The flip-flop 150 may adjust the output timing of each of the first to N-th bits of the error bit stream EBS such that the output timing of each of the first to N-th bits of the error bit stream EBS is the same as output timing of each of the first to N-th indexes of the compensation array CA of the compensation circuit 140.

The DFE coefficient calculator 130 may generate the DFE coefficients ECF based on the bit stream BS, the compensation array CA, and the error bit stream EBS. In an embodiment, the DFE coefficient calculator 130 may perform the training operation based on the sign-sign least mean square (SS-LMS) algorithm. The DFE coefficient calculator 130 may determine whether to increase or decrease a DFE coefficient based on the bit stream BS, the compensation array CA, and the error bit stream EBS.

$$C_k(i+1) = C_k(i) + \sum_{j=1}^{n} CA[j]\mathrm{sgn}(d(i-k)[j])\mathrm{sgn}(e(n)[j]) \quad \text{[Equation 2]}$$

Equation 2 is an equation that is used for the DFE coefficient calculator 130 to calculate a DFE coefficient. In Equation 2, $C_k(i+1)$ is a k-th DFE coefficient obtained through an (i+1)-th training operation, and $C_k(i)$ is the k-th DFE coefficient obtained through an i-th training operation. In Equation 2, CA[j] is a compensation value that a j-th index of the compensation array CA has.

As described above, as the DFE coefficient calculator 130 considers the first to $2^M$-th compensation values, the results of multiplying the first to $2^M$-th count values by the first to $2^M$-th compensation values one-to-one may be even (i.e., may be the same as each other). That is, the DFE coefficient calculator 130 may generate the DFE coefficients ECF based on a ratio of patterns of the bit stream BS being adjusted.

Also, the DFE coefficient calculator 130 may not only count the number of times of coincidence of a data pattern exceeding the count threshold value, but the DFE coefficient calculator 130 may also store the number of times of coincidence of each data pattern in the bit stream BS in a pattern table. In this case, all the data patterns in the bit stream BS may be used to generate the DFE coefficients ECF. As such, each of the DFE coefficients ECF may accurately converge on a target coefficient, and a converging time may decrease.

In the case where the DFE 110 generates the equalization signal ES based on the DFE coefficients ECF converging on the target coefficients and the received signal RS, an eye open status of the equalization signal ES may be improved. Data eyes may be open in an eye pattern. That is, it may be possible to accurately determine data of the equalization signal ES.

Figure 5:
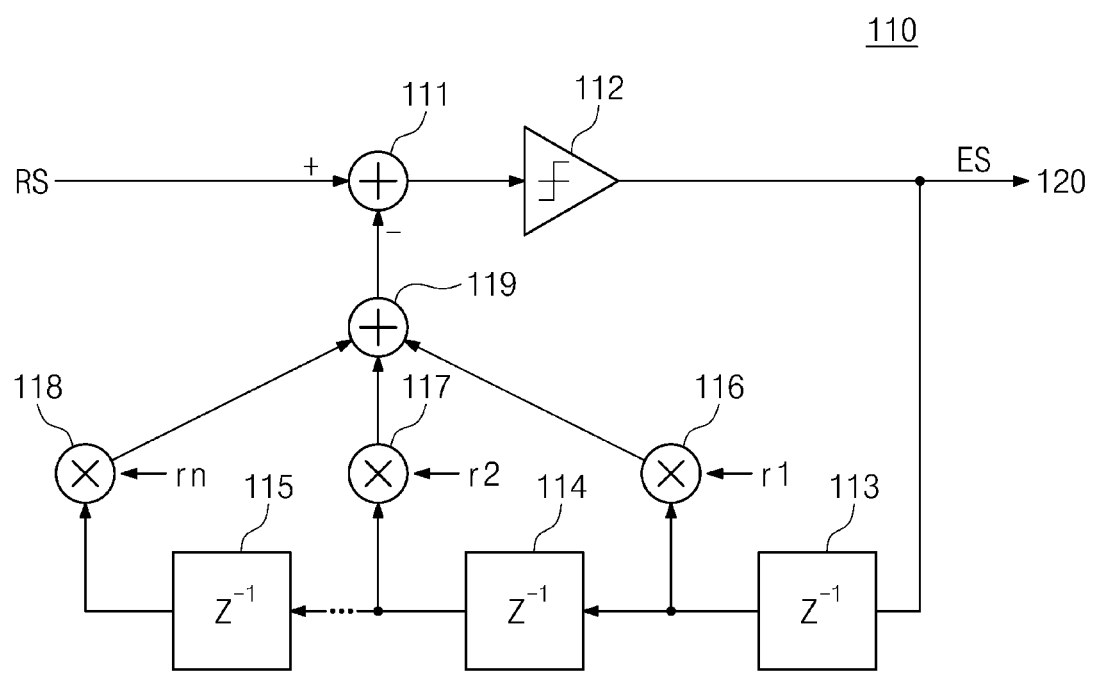
FIG. 5 is a block diagram illustrating a decision feedback equalizer (DFE) of FIG. 4 according to an embodiment of the present disclosure in detail.

FIG. 5 is a block diagram illustrating a configuration of a DFE of FIG. 4 according to an embodiment of the present disclosure. The DFE 110 may include a first adder 111, a slicer 112, delay buffers 113, 114, and 115, multipliers 116, 117, and 118, and a second adder 119.

The first adder 111 may subtract a level of a signal output from the second adder 119 from a level of the received signal RS and may generate a subtraction signal. The first adder 111 may output the subtraction signal to the slicer 112. The slicer 112 may provide decision about a logical value corresponding to the subtraction signal. An output of the slicer 112 may be provided as the equalization signal ES or may be fed back to the delay buffer 113.

Each of the delay buffers 113, 114, and 115 may delay the timing to transfer a signal. The delay buffer 113 may delay the transfer of the output of the slicer 112, and each of the delay buffers 113, 114, and 115 may delay the transfer of an output of a previous delay buffer. The multipliers 116, 117, and 118 may multiply the outputs of the delay buffers 113, 114, and 115 by DFE coefficients r1, r2, and rn, respectively. The DFE coefficients r1, r2, and rn may correspond to the DFE coefficients ECF of FIG. 4. The second adder 119 may add the outputs of the multipliers 116, 117, and 118.

The DFE coefficients r1, r2, and rn may indicate how much signal levels of the outputs of the delay buffers 113, 114, and 115 are increased or decreased. A direction in which signal levels are adjusted (i.e., an increase or decrease of the signal levels) and the amounts by which the signal levels are adjusted may be determined based on the DFE coefficients r1, r2, and rn. Accordingly, characteristics (e.g., a waveform, an eye open status, and a signal level) of the equalization signal ES may change depending on the DFE coefficients r1, r2, and rn.

Figure 6:
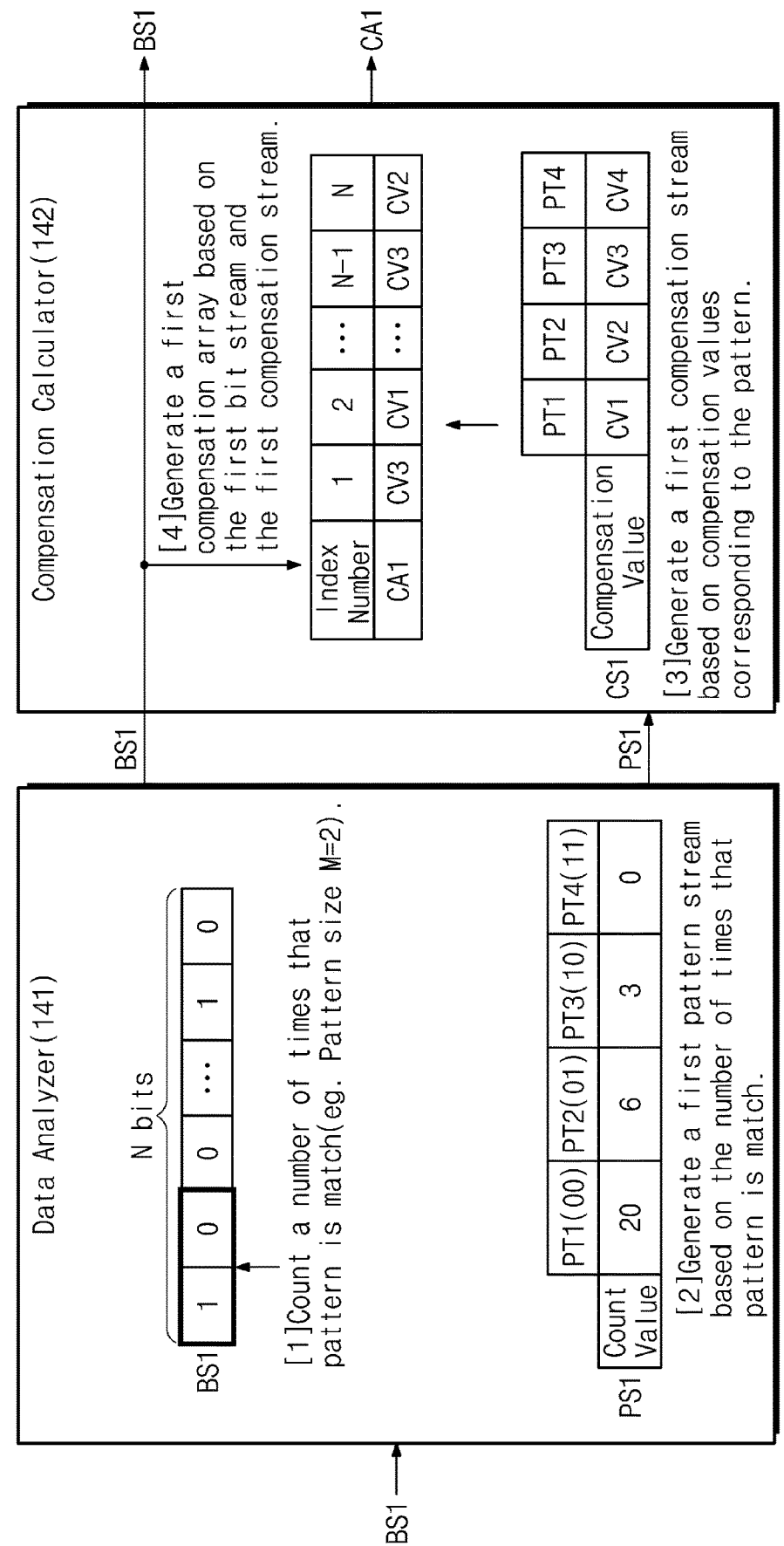
FIG. 6 is a block diagram illustrating a compensation circuit of FIG. 4 according to an embodiment of the present disclosure in detail.

FIG. 6 is a block diagram illustrating a compensation circuit of FIG. 4 according to an embodiment of the present disclosure in detail. Referring to FIG. 6, the compensation circuit 140 may include a data analyzer 141 and a compensation calculator 142.

The data analyzer 141 may receive a first bit stream BS1 having first to N-th bits. In an embodiment, the first bit stream BS1 may be data in which the N-th bit is received prior to the first bit. The second bit and the third bit that are received prior to the first bit may affect the first bit.

The data analyzer 141 may analyze first to $2^M$-th patterns each having an M-bit size from the first bit stream BS1. For example, in the case where "M" is 2, each of data patterns of the first bit stream BS1 may be one of a first pattern PT1 corresponding to a pattern value of "00", a second pattern PT2 corresponding to a pattern value of "01", a third pattern PT3 corresponding to a pattern value of "10", and a fourth pattern PT4 corresponding to a pattern value of "11". When a bit value of a first bit is "1" and a bit value of a second bit is "0", a pattern corresponding to the first bit may be the third pattern PT3. When a bit value of the second bit is "0" and a bit value of a third bit is "0", a pattern corresponding to the second bit may be the first pattern PT1. A pattern corresponding to the N-th bit may include a bit received before or after the N-th bit.

The data analyzer 141 may count the number of times of coincidence (or detection) of each of the first to $2^M$-th patterns from the first bit stream BS1. For example, based on the pattern corresponding to the first bit being the third pattern PT3, the data analyzer 141 may increase a count value of the third pattern PT3. Based on the pattern corresponding to the second bit being the first pattern PT1, the data analyzer 141 may increase a count value of the first pattern PT1. In counting, the data analyzer 141 may scan through the first bit stream BS1 from the first bit to N-th in a unit of a pattern to be counted. In a case that the unit of a pattern to be counted is two bits (e.g., M being two), the data analyzer 141 may check first two bits "10" in the first bit stream BS1, and then check second two bits "00". The data analyzer 141 may continue to scan through the first bit stream BS1 to check the last two bits "10" thereof. In other words, each bit in the first bit stream BS1 except for the first bit and the last bit (e.g., N-th bit) may be included in two consecutive patterns on which the counting operation is performed.

In an embodiment, the data analyzer 141 may generate a first pattern stream PS1 based on the first to $2^M$-th count values. For example, when the number of first patterns PT1 detected (or determined) from the first bit stream BS1) is "20", a first count value may be "20"; when the number of second patterns PT2 detected (or determined) from the first bit stream BS1 is "6", a second count value may be "6"; when the number of third pattern PT3 detected (or determined) from the first bit stream BS1 is "3", a third count value may be "3"; when the number of fourth pattern PT4 detected (or determined) from the first bit stream BS1 is "0", a fourth count value may be "b 0".

Whenever the data analyzer 141 determines the number of times of coincidence (or detection) of each of the first to $2^M$-th patterns with respect to the first bit stream BS1, the data analyzer 141 may determine a dominant cursor based on first to N-th analog voltage levels. In an embodiment, the first to N-th bits of the first bit stream BS1 may have the first to N-th analog voltage levels, respectively.

Referring to FIG. 2B, in the case of compensating for signal distortion in units of three bits, a first analog voltage level may correspond to the main cursor component V0, a second analog voltage level may correspond to the first post cursor component V1, and a third analog voltage level may correspond to the second post cursor component V2.

The data analyzer 141 may determine that the first post cursor corresponds to the dominant cursor, based on the first post cursor component V1 being greater than the second post cursor component V2. That is, in the case of determining the first to $2^M$-th patterns in units of three bits, the data analyzer 141 may determine that the second bit of the three bits corresponds to the dominant cursor. However, the data analyzer 141 may change a bit corresponding to the dominant cursor, depending on a position of a bit corresponding to a cursor having a great influence on the main cursor from among a plurality of post cursors (or depending on a position tendency of the bit corresponding to the cursor).

Whenever the data analyzer 141 determines the first to $2^M$-th patterns with respect to the first bit stream BS1, the data analyzer 141 may calculate a ratio indicating whether the bit corresponding to the dominant cursor has a first bit value or a second bit value. In an embodiment, the first bit value may be "1", and the second bit value may be "0".

The compensation calculator 142 may generate the first to $2^M$-th compensation values such that results of (or values obtained by) multiplying the first to $2^M$-th count values by the first to $2^M$-th compensation values one-to-one (i.e., respectively) are even. A method in which the compensation calculator 142 generates the first to $2^M$-th compensation values respectively corresponding to the first to $2^M$-th patterns will be described in detail with reference to FIGS. 7 and 8.

In an embodiment, the compensation calculator 142 may generate the first to $2^M$-th compensation values further in consideration of the ratio indicating whether a bit corresponding to a dominant cursor has a first bit value or a second bit value. That is, the compensation calculator 142 may adjust a ratio of a bit of a dominant cursor having the first bit value and a bit of a dominant cursor having the second bit value, based on the first to $2^M$-th compensation values.

In the case of generating the first to $2^M$-th compensation values further in consideration of a ratio indicating whether a bit corresponding to a dominant cursor has the first bit value or the second bit value, DFE coefficients may accurately converge on target coefficients, and a converging time may also decrease. In particular, in the case of considering a dominant cursor when the number of detected data pattern types is small, DFE coefficients may effectively converge on target coefficients.

The compensation calculator 142 may generate a first compensation stream CS1 including the first to $2^M$-th compensation values. The first compensation stream CS1 may include the first to $2^M$-th compensation values respectively corresponding to the first to $2^M$-th patterns.

The compensation calculator 142 may generate a first compensation array CA1 based on the first compensation stream CS1 and the first bit stream BS1. The first compensation array CA1 may include first to N-th indexes. Each of the first to N-th indexes of the first compensation array CA1 may have one of the first to $2^M$-th compensation values. In an embodiment, the first compensation array CA1 may have a two-dimensional array structure.

For example, in the case where a pattern corresponding to a first bit of the first bit stream BS1 is the third pattern PT3, the first index of the first compensation array CA1 may have a third compensation value CV3. In the case where a pattern corresponding to a second bit of the first bit stream BS1 is the first pattern PT1, the second index of the first compensation array CA1 may have a first compensation value CV1.

Figure 7:
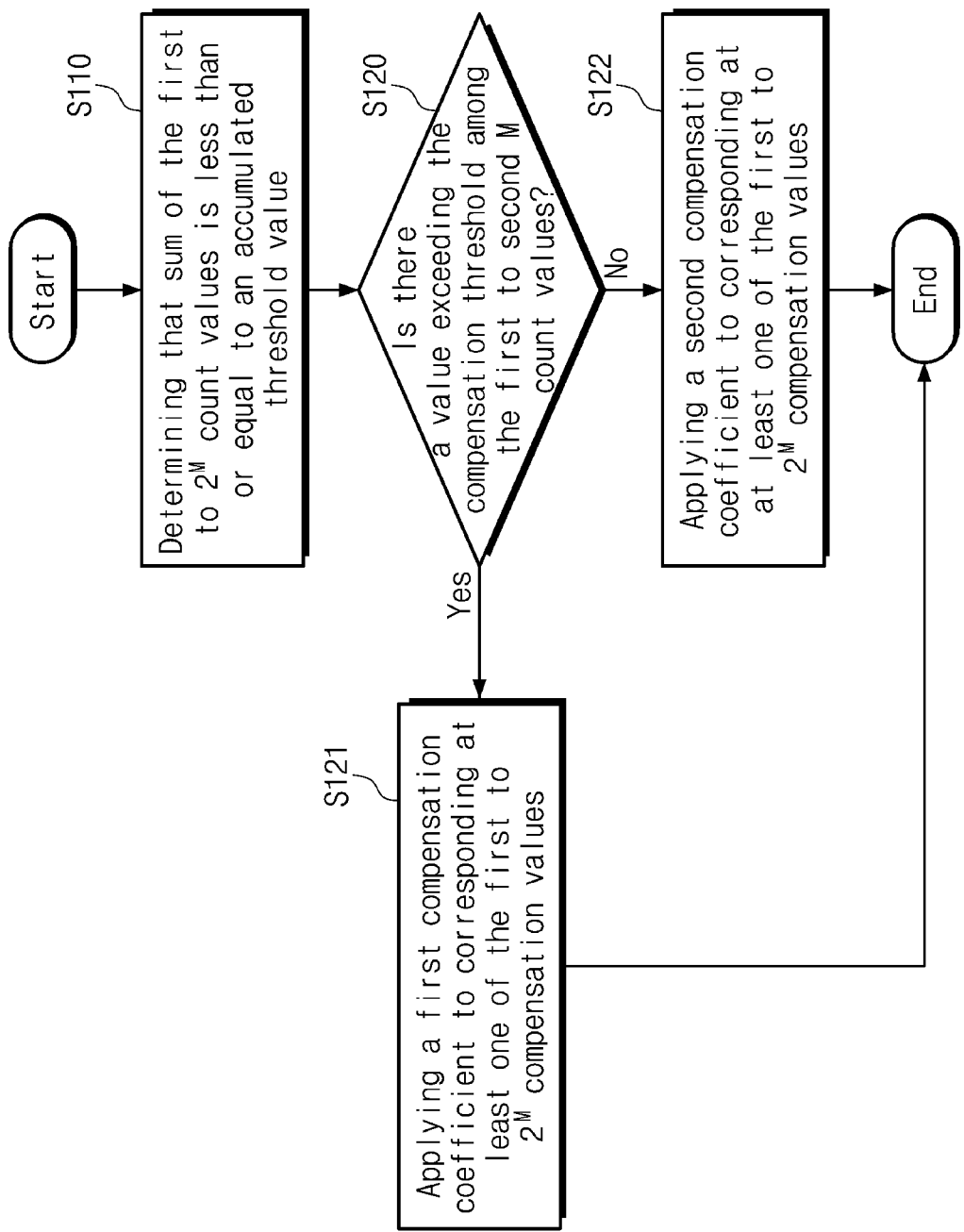
FIG. 7 is a flowchart illustrating an operation of a compensation calculator of FIG. 6 according to an embodiment of the present disclosure in detail.

FIG. 7 is a flowchart illustrating an operation of a compensation calculator of FIG. 6 according to an embodiment of the present disclosure in detail. An operating method of the compensation calculator 142 will be described with reference to FIGS. 6 and 7.

In operation S110, the compensation calculator 142 may determine whether a sum of the first to $2^M$-th count values stored in the first pattern stream PS1 is less than or equal to an accumulated threshold value. The accumulated threshold value may be a value that a sum of the first to $2^M$-th count values should at least have for the purpose of generating the first to $2^M$-th compensation values based on the first to $2^M$-th count values. For example, when the first count value is "0", the second count value is "20", the third count value is "20", the fourth count value is "0", and the accumulated threshold value is "50", the compensation calculator 142 may determine that the sum of the first to fourth count values stored in the first pattern stream PS1 is less than or equal to the accumulated threshold value.

In operation S120, the compensation calculator 142 may determine whether there is a count value exceeding a compensation threshold value from among the first to $2^M$-th count values. The compensation threshold value may be a value that the first to $2^M$-th count values should at least have for the purpose of generating the first to $2^M$-th compensation values. Operation S121 may be performed on a count value exceeding the compensation threshold value from among the first to $2^M$-th count values. Operation S122 may be performed on a count value less than or equal to the compensation threshold value from among the first to $2^M$-th count values.

In operation S121, the compensation calculator 142 may apply a first compensation coefficient to a compensation value corresponding to the count value exceeding the compensation threshold value from among the first to $2^M$-th count values. For example, when the first count value is "0", the second count value is "20", the third count value is "20", the fourth count value is "0", and the compensation threshold value is "2", the compensation calculator 142 may apply the first compensation coefficient to the second compensation value corresponding to the second count value and may apply the first compensation coefficient to the third compensation value corresponding to the third count value.

In operation S122, the compensation calculator 142 may apply a second compensation coefficient to a compensation value corresponding to the count value less than or equal to the compensation threshold value from among the first to $2^M$-th count values. For example, when the first count value is "0", the second count value is "20", the third count value is "20", the fourth count value is "0", and the compensation threshold value is "2", the compensation calculator 142 may apply the second compensation coefficient to the first compensation value corresponding to the first count value and may apply the second compensation coefficient to the fourth compensation value corresponding to the fourth count value. The first compensation coefficient may be smaller than the second compensation coefficient. For example, the first compensation coefficient may be "1", and the second compensation coefficient may be "10".

As described above, as the compensation calculator 142 applies the first compensation coefficient to a compensation value corresponding to a count value exceeding the compensation threshold value and applies the second compensation coefficient to a compensation value corresponding to a count value less than or equal to the compensation threshold value, in the case where a sum of the first to $2^M$-th count values of the first pattern stream PS1 does not exceed the accumulated threshold value, it may be possible to reduce the influence of patterns each having a count value exceeding the compensation threshold value.

Figure 8:
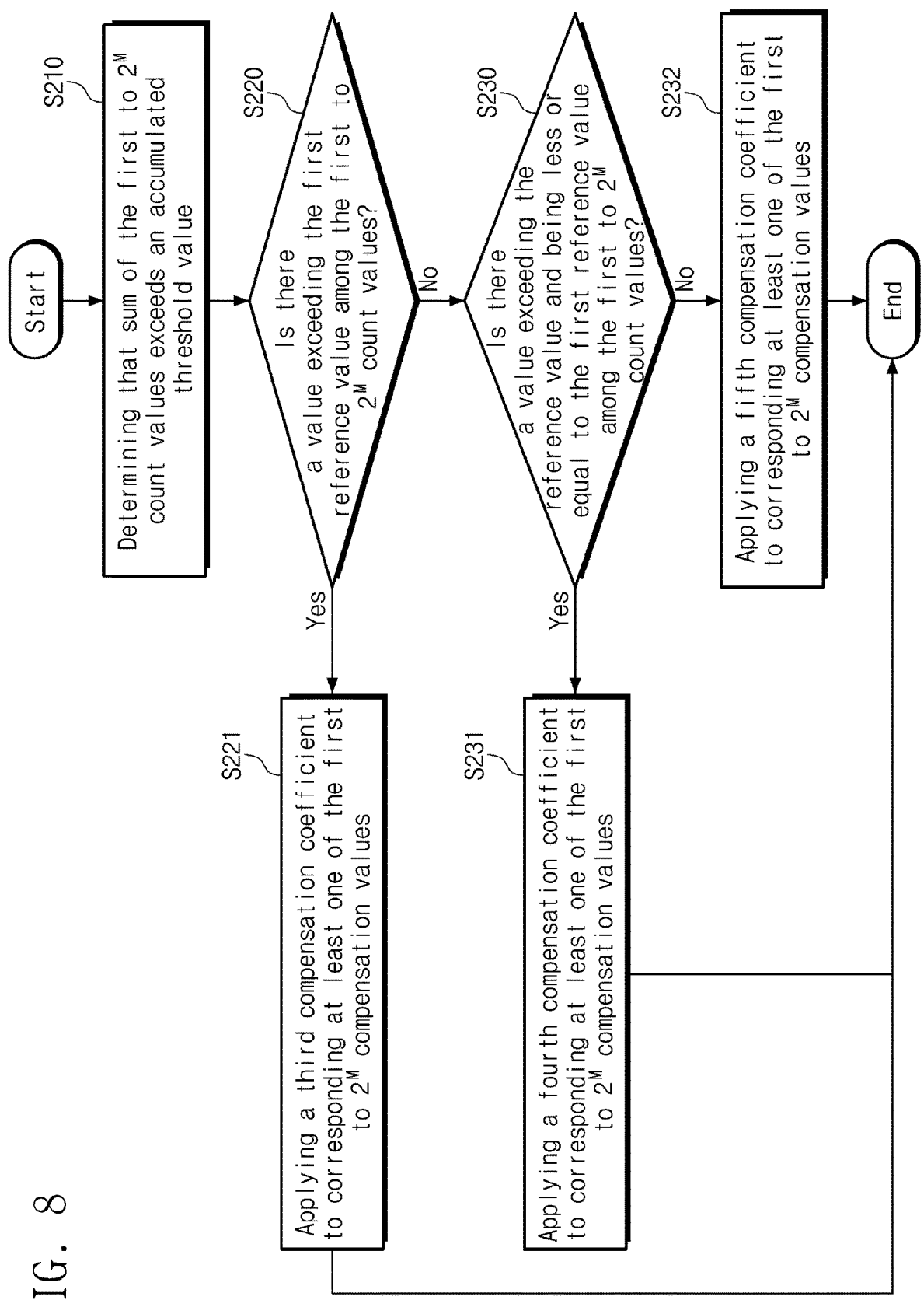
FIG. 8 is a flowchart illustrating an operation of a compensation calculator of FIG. 6 according to an embodiment of the present disclosure in detail.

FIG. 8 is a flowchart illustrating an operation of a compensation calculator of FIG. 6 according to an embodiment of the present disclosure in detail. An operating method of the compensation calculator 142 will be described with reference to FIGS. 6 and 8.

In operation S210, the compensation calculator 142 may determine whether a sum of the first to $2^M$-th count values stored in the first pattern stream PS1 exceeds the accumulated threshold value. For example, when the first count value is "4", the second count value is "18", the third count value is "14", the fourth count value is "4", and the accumulated threshold value is "30", the compensation calculator 142 may determine that the sum of the first to fourth count values stored in the first pattern stream PS1 exceeds the accumulated threshold value.

In operation S220, the compensation calculator 142 may determine whether there is a count value exceeding a first reference value from among the first to $2^M$-th count values. Operation S221 may be performed on a count value exceeding the first reference value from among the first to $2^M$-th count values. Operation S230 may be performed on a count value less than or equal to the first reference value from among the first to $2^M$-th count values.

In operation S221, the compensation calculator 142 may apply a third compensation coefficient to a compensation value corresponding to a count value exceeding the first reference value from among the first to $2^M$-th count values. For example, when the first count value is "4", the second count value is "18", the third count value is "14", the fourth count value is "4", and the first reference value is "15", the compensation calculator 142 may apply the third compensation coefficient to the second compensation value corresponding to the second count value.

In operation S230, the compensation calculator 142 may determine whether there is a count value, which is less than or equal to the first reference value and exceeds a second reference value, from among the first to $2^M$-th count values. Operation S231 may be performed on a count value that is less than or equal to the first reference value and exceeds a second reference value. Operation S232 may be performed on a count value that is less than or equal to the second reference value. The first reference value may be greater than the second reference value.

In operation S231, the compensation calculator 142 may apply a fourth compensation coefficient to a compensation value corresponding to the count value, which is less than or equal to the first reference value and exceeds the second reference value, from among the first to $2^M$-th count values. For example, when the first count value is "4", the second count value is "18", the third count value is "14", the fourth count value is "4", the first reference value is "15", and the second reference value is "10", the compensation calculator 142 may apply a fourth compensation coefficient to the third compensation value corresponding to the third count value. The third compensation coefficient may be smaller than the fourth compensation coefficient. For example, the third compensation coefficient may be "3", and the fourth compensation coefficient may be "4".

In operation S232, the compensation calculator 142 may apply a fifth compensation coefficient to a compensation value corresponding to a count value less than or equal to the second reference value from among the first to $2^M$-th count values. For example, when the first count value is "4", the second count value is "18", the third count value is "14", the fourth count value is "4", and the second reference value is "10", the compensation calculator 142 may apply the fifth compensation coefficient to the first compensation value corresponding to the first count value and may apply the fifth compensation coefficient to the fourth compensation value corresponding to the fourth count value. The fourth compensation coefficient may be smaller than the fifth compensation coefficient. For example, the fourth compensation coefficient may be "4", and the fifth compensation coefficient may be "14".

As described above, as the compensation calculator 142 applies the third to fifth compensation coefficients to compensation values corresponding to the first to fourth count values, the first compensation value may be "14", the second compensation value may be "3", the third compensation value may be "4", and the fourth compensation value may be "14". A value obtained by multiplying the first count value by the first compensation value may be "56", a value obtained by multiplying the second count value by the second compensation value may be "54", a value obtained by multiplying the third count value by the third compensation value may be "56", and a value obtained by multiplying the fourth count value by the fourth compensation value may be "56". This may mean that the values obtained by multiplying the first count values by the first to fourth compensation values one-to-one are even. In an embodiment, a difference between the values obtained by multiplying each of the first to fourth count values by a corresponding one of the first to fourth compensation values may be smaller than a difference between the first to fourth count values.

FIG. 8 shows the example in which the first to third compensation coefficients are applied to compensation values corresponding to the first to $2^M$-th count values based on the first and second reference values, but the present disclosure is not limited thereto. For example, the compensation calculator 142 may apply four or more compensation coefficients to compensation values corresponding to the first to $2^M$-th counts based on a plurality of reference values, for example, three or more reference values.

Figure 9:
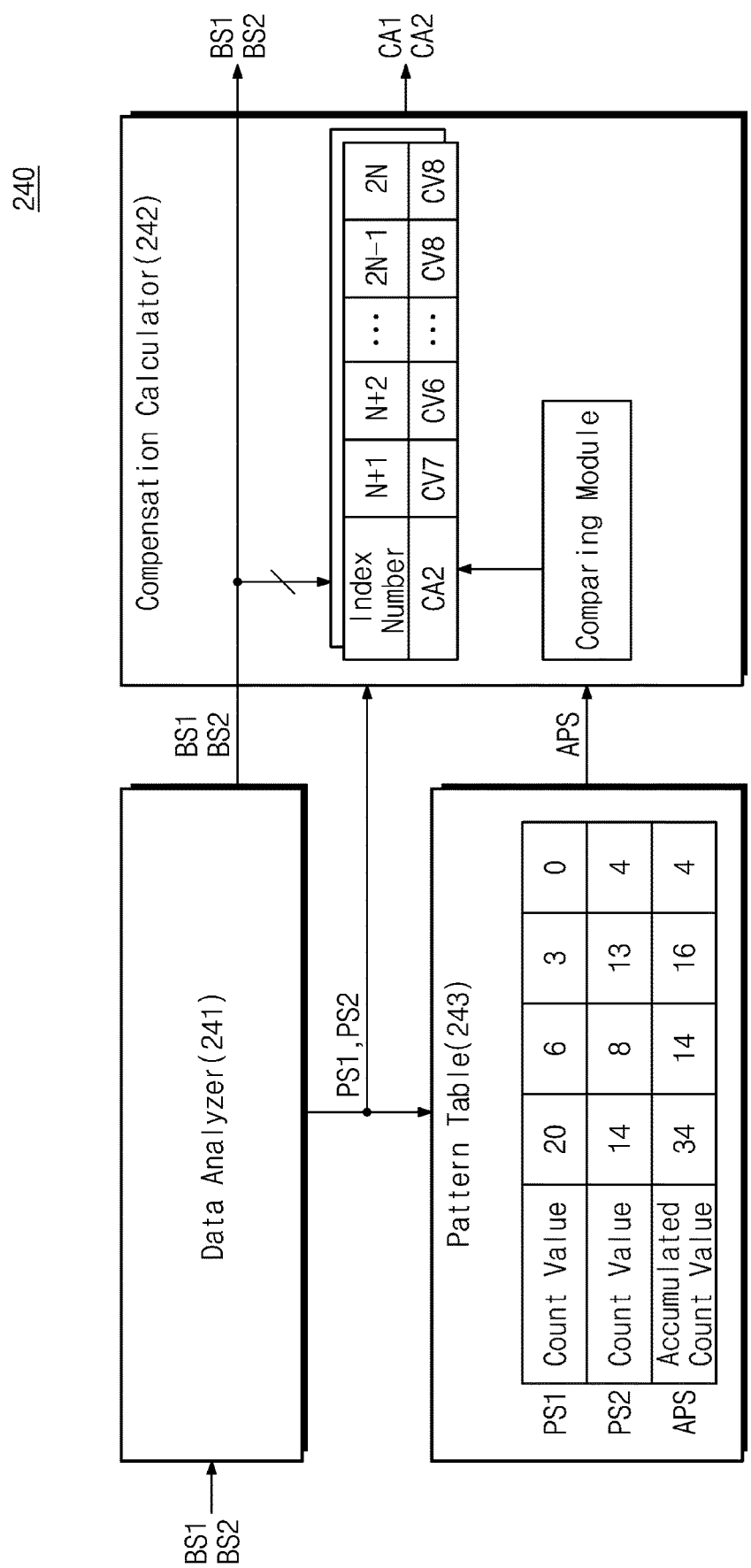
FIG. 9 is a block diagram illustrating a compensation circuit of FIG. 4 according to an embodiment of the present disclosure in detail.

FIG. 9 is a block diagram illustrating a compensation circuit of FIG. 4 according to an embodiment of the present disclosure in detail. Referring to FIG. 9, a compensation circuit 240 may include a data analyzer 241, a compensation calculator 242, and a pattern table 243. The data analyzer 241 and the compensation calculator 242 may correspond to the data analyzer 141 and the compensation calculator 142 of FIG. 6, respectively.

The data analyzer 241 may receive the first bit stream BS1 and a second bit stream BS2. The first bit stream BS1 may include first to N-th bits. The second bit stream BS2 may include (N+1)-th to 2N-th bits. In an embodiment, the data analyzer 241 may receive the first bit stream BS1 before the second bit stream BS2. The data analyzer 241 may first receive the (N+1)-th to 2N-th bits. The (N+2)-th bit and the (N+3)-th bit that are received prior to the (N+1)-th bit may affect the (N+1)-th bit.

The data analyzer 241 may analyze data patterns each having an M-bit size from the second bit stream BS2. In an embodiment, the data analyzer 241 may count the number of times of coincidence (or detection) of each of the first to $2^M$-th patterns from the second bit stream BS2. The data analyzer 241 may generate $(2^M+1)$-th to $2^{M+1}$-th count values from the second bit stream BS2 based on the number of times of coincidence of each of the first to $2^M$-th patterns. The data analyzer 241 may generate a second pattern stream PS2 based on the $(2^M+1)$-th to $2^{M+1}$-th count values.

The pattern table 243 may store the first pattern stream PS1 and the second pattern stream PS2. The pattern table 243 may generate an accumulated pattern stream APS by accumulating pattern streams that the data analyzer 241 generates. The pattern table 243 may generate the accumulated pattern stream APS including first to $2^M$-th accumulated count values based on the first pattern stream PS1 and the second pattern stream PS2. In an embodiment, the pattern table 243 may be implemented with (i.e., may be stored in) a memory or a register.

In an embodiment, the first to $2^M$-th accumulated count values may respectively correspond to sums of the first to $2^M$-th count values of the first pattern stream PS1 and the $(2^M+1)$-th to $2^{M+1}$-th count values of the second pattern stream PS2. For example, in a case that the first count value of the first pattern stream PS1 is "20" and the $(2^M+1)$-th count value of the second pattern stream PS2 is "14", the first accumulated count value may be "34".

In an embodiment, when at least one of the first to $2^M$-th count values of the first pattern stream PS1 exceeds a scaling reference value, the first to $2^M$-th count values may be downscaled. The scaling reference value may be a reference for determining whether the first to $2^M$-th count values are sufficiently accumulated from the first pattern stream PS1 for the purpose of generating $(2^M+1)$-th to $2^{M+1}$-th compensation values.

As in the above description, the first to $2^M$-th accumulated count values may respectively correspond to sums of the downscaled first to $2^M$-th count values and the $(2^M+1)$-th to $2^M+1$-th count values of the second pattern stream PS2. As the accumulated pattern stream APS is generated based on the downscaled first to $2^M$-th count values, the influence of the second pattern stream PS2 may be relatively great in the accumulated pattern stream APS compared to the first pattern stream PS1.

In an embodiment, the first to $2^M$-th count values may be downscaled when a threshold time passes from a time point when the first pattern stream PS1 is generated. The threshold time may be a reference for reducing the influence of the first pattern stream PS1 rather than the second pattern stream PS2.

The compensation calculator 242 may generate the $(2^M+1)$-th to $2^{M+1}$-th compensation values based on the first bit stream BS1, the second bit stream BS2, and the accumulated pattern stream APS. The first to $2^M$-th patterns of the second pattern stream PS2 may correspond to the $(2^M+1)$-th to $2^{M+1}$-th compensation values, respectively.

The compensation calculator 242 may determine whether a sum of first to $2^M$-th count values of an accumulated pattern stream is less than or equal to the accumulated threshold value, through a comparing module. When it is determined that the sum of the first to $2^M$-th count values is less than or equal to the accumulated threshold value, $(2^M+1)$-th to $2^{M+1}$-th compensation values may be generated depending on whether the $(2^M+1)$-th to $2^{M+1}$-th count values are more than the compensation threshold value or are less than the compensation threshold value.

In an embodiment, the compensation calculator 242 may apply the first compensation coefficient to a compensation value corresponding to a count value exceeding the compensation threshold value from among the $(2^M+1)$-th to $2^{M+1}$-th count values. The compensation calculator 242 may apply the second compensation coefficient to a compensation value corresponding to a count value less than or equal to the compensation threshold value from among the $(2^M+1)$-th to $2^{M+1}$-th count values.

As such, until the sum of the first to $2^M$-th accumulated count values is accumulated to have the accumulated threshold value (or reaches the accumulated threshold value), under control of the compensation calculator 242, a ratio of patterns corresponding to count values exceeding the compensation threshold value from among the $(2^M+1)$-th to $2^{M+1}$-th count values may be adjusted to decrease.

The compensation calculator 242 may determine whether a sum of first to $2^M$-th accumulated count values of an accumulated pattern stream exceeds the accumulated threshold value, through the comparing module. When it is determined that the sum of the first to $2^M$-th accumulated count values exceeds the accumulated threshold value, the $(2^M+1)$-th to $2^{M+1}$-th compensation values may be generated such that sum values are even which are obtained by adding 1) results of multiplying the $(2^M+1)$-th to $2^{M+1}$-th count values of the second pattern stream PS2 by the $(2^M+1)$-th to $2^{M+1}$-th compensation values one-to-one (i.e., respectively) to 2) the first to $2^M$-th accumulated count values for each pattern.

In an embodiment, the compensation calculator 242 may apply the third compensation coefficient to a compensation value corresponding to an accumulated count value exceeding the first reference value from among the first to $2^M$-th accumulated count values. The compensation calculator 242 may apply the fourth compensation coefficient to a compensation value corresponding to an accumulated count value, which is less than or equal to the first reference value and exceeds the second reference value, from among the first to $2^M$-th accumulated count values. The compensation calculator 242 may apply the fifth compensation coefficient to a compensation value corresponding to a count value less than or equal to the second reference value. The compensation calculator 242 may generate a second compensation stream including the $(2^M+1)$-th to $2^{M+1}$-th compensation values. The compensation calculator 242 may generate a second compensation array CA2 based on the second compensation stream and the second bit stream BS2. The second compensation array CA2 may include (N+1)-th to 2N-th indexes. Each of the (N+1)-th to 2N-th indexes of the second compensation array CA2 may have one of the $(2^M+1)$-th to $2^{M+1}$-th compensation values. In an embodiment, the second compensation array CA2 may have a two-dimensional array structure.

FIG. 10 is a diagram describing an operation of a data analyzer of FIG. 6 according to an embodiment of the present disclosure. An operation in which the data analyzer 141 counts the number of times of coincidence (or detection) of each of first to $2^M$-th patterns based on the first bit stream BS1 and the bit stream BS is illustrated in FIG. 10. The bit stream BS may precede the first bit stream BS1.

The data analyzer 141 may consider the bit stream BS received before the first bit stream BS1 when counting the number of times of coincidence (or detection) of each of the first to $2^M$-th patterns from the first bit stream BS1.

In an embodiment, the data analyzer 141 may determine whether a pattern of the N-th bit of the first bit stream BS1 and the most significant bit of the bit stream BS positioned immediately before the first bit stream BS1 corresponds to any one of the first to $2^M$-th patterns. For example, the data analyzer 141 may increase a count value of the pattern composed of the N-th bit of the first bit stream BS1 and the (N+1)-th bit of the bit stream BS positioned immediately before the first bit stream BS1.

For example, when "M" is "2", the data analyzer 141 may update a count value of the second pattern based on a bit value of the N-th bit of the first bit stream BS1 being "0" and a bit value of the (N+1)-th bit of the bit stream BS positioned immediately before the first bit stream BS1 being "1".

Figure 11:
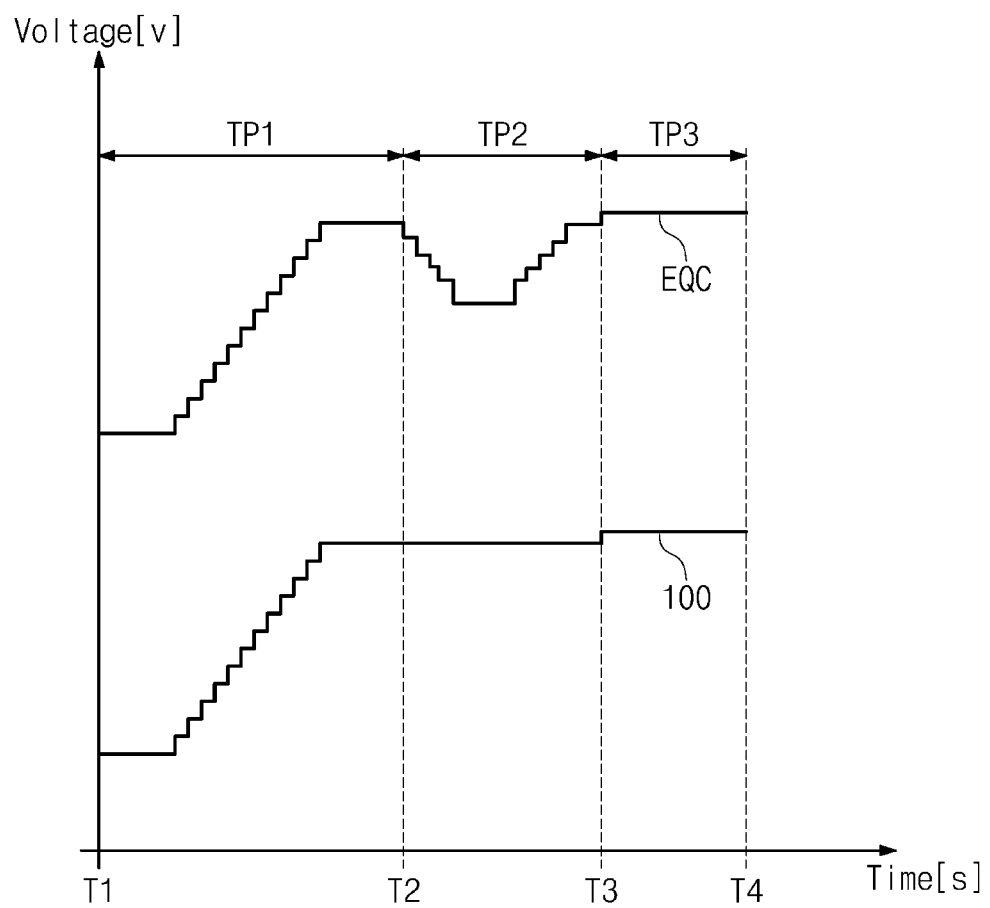
FIG. 11 is a graph describing a DFE coefficient generated based on compensation values according to an embodiment of the present disclosure.

FIG. 11 is a graph describing a DFE coefficient generated based on compensation values according to an embodiment of the present disclosure. The first DFE coefficient of the equalizer circuit EQC of FIG. 3 and the first DFE coefficient of the equalizer circuit 100 of FIG. 4 are illustrated in FIG. 11. In FIG. 11, a horizontal axis represents a time, and a vertical axis represents a voltage.

A first time period TP1 may be a time period from a first point in time T1 to a second point in time T2. Count values of data patterns in the bit stream BS may be even during the first time period TP1. During the first time period TP1, the equalizer circuit EQC may perform the training operation such that the first DFE coefficient converges on a coefficient corresponding to the first post cursor component. Also, during the first time period TP1, the equalizer circuit 100 may perform the training operation such that the first DFE coefficient converges on a coefficient corresponding to the first post cursor component.

A second time period TP2 may be a time period from the second point in time T2 to a third point in time T3. Count values of data patterns in the bit stream BS may be uneven during the second time period TP2. For example, the second time period TP2 may be a time period in which the bit stream BS corresponding to a clock signal is received.

Because the count values of the data patterns in the bit stream BS are uneven, the first DFE coefficient that the equalizer circuit EQC generates during the second time period TP2 may not converge on the coefficient corresponding to the first post cursor component. The equalizer circuit EQC may again perform the training operation such that the first DFE coefficient converges on the coefficient corresponding to the first post cursor component.

Because the equalizer circuit 100 generates the first DFE coefficient based on compensation values such that the count values of the data patterns in the bit stream BS are even, the first DFE coefficient that the equalizer circuit 100 generates during the second time period TP2 may stably converge on the coefficient corresponding to the first post cursor component. That is, even though the count values of the data patterns in the bit stream BS are uneven, the equalizer circuit 100 may generate the first DFE coefficient converging on the coefficient corresponding to the first post cursor component.

A third time period TP3 may be a time period from the third point in time T3 to a fourth point in time T4. Count values of data patterns in the bit stream BS may be even during the third time period TP3. The first DFE coefficient that the equalizer circuit EQC generates during the third time period TP3 may stably converge on the coefficient corresponding to the first post cursor component. Also, the first DFE coefficient that the equalizer circuit 100 generates during the third time period TP3 may stably converge on the coefficient corresponding to the first post cursor component.

Figure 12:
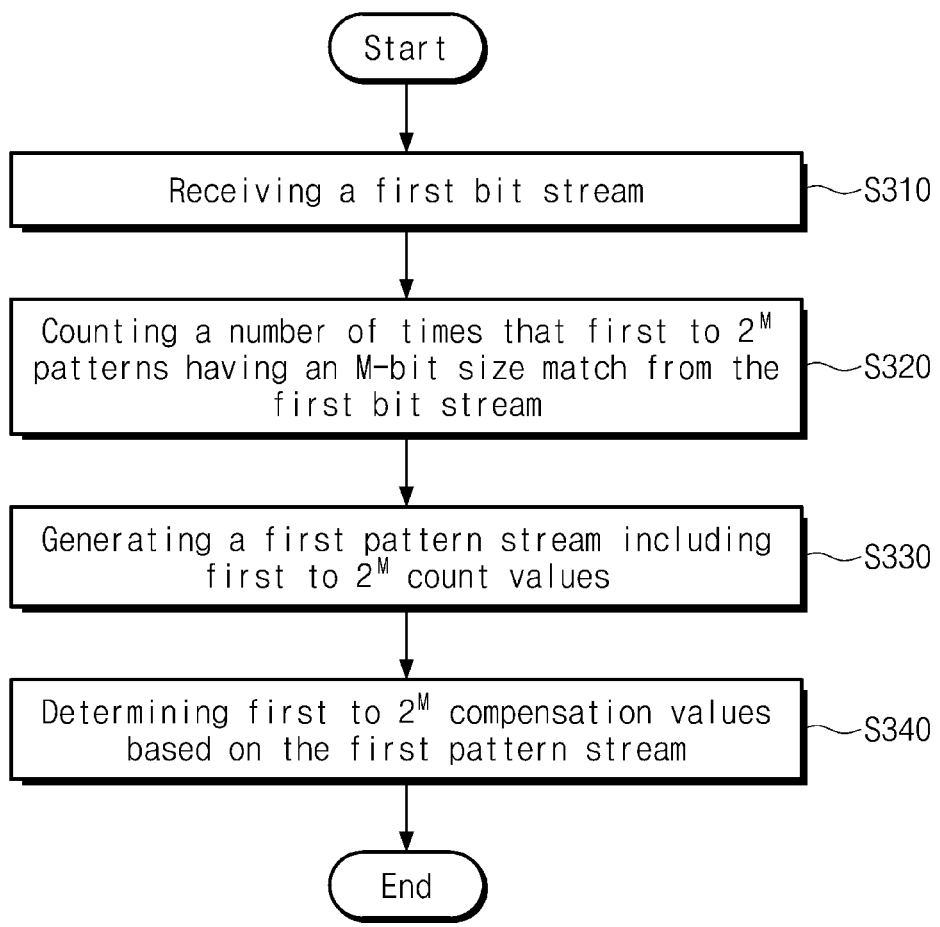
FIG. 12 is a flowchart illustrating an operation of a compensation circuit of FIG. 6 according to an embodiment of the present disclosure in detail.

FIG. 12 is a flowchart illustrating an operation of a compensation circuit of FIG. 6 according to an embodiment of the present disclosure in detail. An operation of the compensation circuit 140 will be described with reference to FIGS. 6 and 12.

In operation S310, the compensation circuit 140 may receive the first bit stream BS1 including first to N-th bits. In an embodiment, the first bit stream BS1 may be data in which the N-th bit is received prior to the first bit.

In operation S320, the compensation circuit 140 may count the number of times of coincidence (or detection) of each of first to $2^M$-th patterns from the first bit stream BS1. For example, when "M" is "2", the compensation circuit 140 may count the number of times of coincidence of each of the first pattern PT1, the second pattern PT2, the third pattern PT3, and the fourth pattern PT4 from the first bit stream BS1. A pattern value of the first pattern PT1 may correspond to "00", a pattern value of the second pattern PT2 may correspond to "01", a pattern value of the third pattern PT3 may correspond to "10", and a pattern value of the fourth pattern PT4 may correspond to "11".

In operation S330, the compensation circuit 140 may generate the first pattern stream PS1 including first to $2^M$-th count values. Each of the first to $2^M$-th count values may refer to the number of times of coincidence of each of the first to $2^M$-th patterns. For example, when the number of times of coincidence (or detection) of the first pattern PT1 in the first bit stream BS1 is "20", the first count value may be "20"; when the number of times of coincidence of the second pattern PT2 in the first bit stream BS1 is "6", the second count value may be "6"; when the number of times of coincidence of the third pattern PT3 in the first bit stream BS1 is "3", the third count value may be "3"; when the number of times of coincidence of the fourth pattern PT4 in the first bit stream BS1 is "0", the fourth count value may be "0".

In operation S340, the compensation circuit 140 may determine first to $2^M$-th compensation values based on the first pattern stream PS1. The compensation circuit 140 may determine the first to $2^M$-th compensation values such that results of (or values obtained by) multiplying the first to $2^M$-th count values by the first to $2^M$-th compensation values one-to-one are even.

In detail, the compensation circuit 140 may determine whether a sum of the first to $2^M$-th count values stored in the first pattern stream PS1 is less than or equal to the accumulated threshold value. The accumulated threshold value may be a value that the sum of the first to $2^M$-th count values should at least have for the purpose of generating the first to $2^M$-th compensation values based on the first to $2^M$-th count values.

When it is determined that the sum of the first to $2^M$-th count values stored in the first pattern stream PS1 is less than or equal to the accumulated threshold value, the compensation circuit 140 may apply the first compensation coefficient to a compensation value corresponding to a count value exceeding the compensation threshold value from among the first to $2^M$-th count values. The compensation circuit 140 may apply the second compensation coefficient to a compensation value corresponding to a count value less than or equal to the compensation threshold value from among the first to $2^M$-th count values. The first compensation coefficient may be smaller than the second compensation coefficient.

When it is determined that the sum of the first to $2^M$-th count values stored in the first pattern stream PS1 exceeds the accumulated threshold value, the compensation circuit 140 may apply the third compensation coefficient to a compensation value corresponding to a count value exceeding the first reference value from among the first to $2^M$-th count values. The compensation circuit 140 may apply the fourth compensation coefficient to a compensation value corresponding to a count value, which is less than or equal to the first reference value and exceeds the second reference value, from among the first to $2^M$-th count values. The compensation circuit 140 may apply the fifth compensation coefficient to a compensation value corresponding to the count value less than or equal to the second reference value from among the first to $2^M$-th count values. The first reference value may be greater than the second reference value, and the second reference value may be greater than the compensation threshold value. The third compensation coefficient may be smaller than the fourth compensation coefficient, and the fourth compensation coefficient may be smaller than the fifth compensation coefficient.

Figure 13:
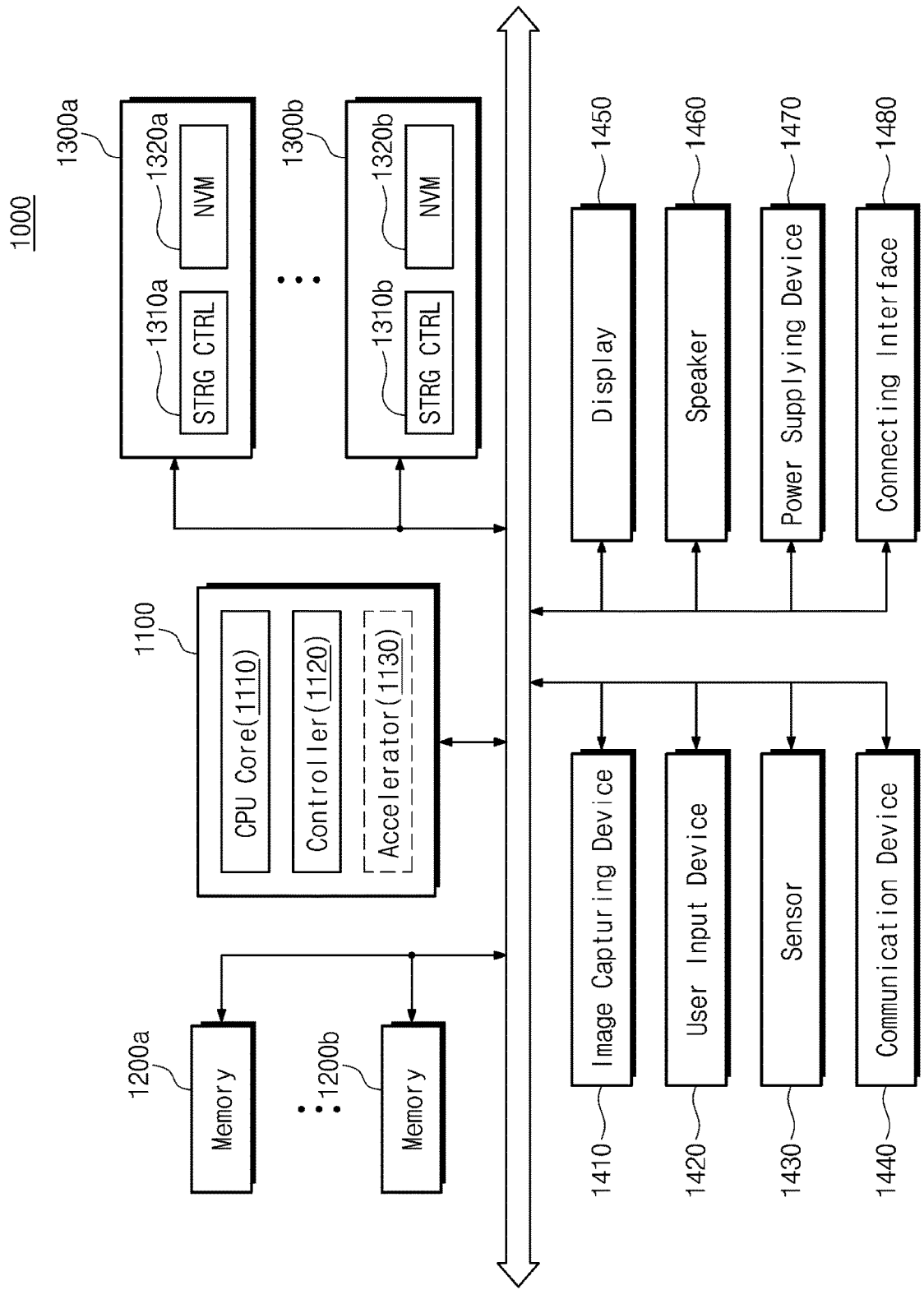
FIG. 13 illustrates a block diagram of a system according to an embodiment of the present disclosure.

FIG. 13 is a diagram of a system 1000 to which a storage device is applied, according to an embodiment. The system 1000 of FIG. 13 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 1 is not necessarily limited to the mobile system and may be a PC, a laptop computer, a server, a media player, or an automotive device (e.g., a navigation device).

Referring to FIG. 13, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The memory 1200a may include a memory controller and a plurality of dynamic random access memory (DRAM) devices. The DRAM device may communicate with the memory controller over a channel. Each of the memory controller and the DRAM devices may include the receiving device 12 including the equalizer circuit 100 of FIG. 1. The equalizer circuit 100 may include the DFE 110, the deserializer 120, the DFE coefficient calculator 130, the compensation circuit 140, and the flip-flip 150 of FIG. 4. As such, the quality of communication between the DRAM devices in the memory 1200a may be improved.

The DRAM devices and the memory controller may communicate based on a double data rate (DDR) interface, but the scope of the present invention is not limited thereto, and the DRAM devices and the memory controller can communicate based on at least one of various interfaces, such as a universal serial bus (USB), multimedia card), PCI (peripheral component interconnection), PCI-E (PCI-express), ATA (Advanced Technology Attachment), SATA (Serial-ATA), PATA (Parallel-ATA), SCSI (small computer small interface), ESDI (enhanced small disk interface), IDE (Integrated Drive Electronics), MIPI (Mobile Industry Processor Interface), NVM-e (Nonvolatile Memory-express), or a NAND interface.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVM (Non-Volatile Memory)s 1320a and 1320b configured to store data via the control of the storage controllers 1310a and 1310b.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A compensation circuit comprising:
    a data analyzer configured to:
        receive a first bit stream including first to N-th bits,
        count a number of times of coincidence of each of first to $2^M$-th patterns from the first bit stream, a size of each pattern of the first to 2M-th patterns being M bits, and
        generate a first pattern stream including first to $2^M$-th count values, each count value of the first to $2^M$-th count values corresponding to a number of times of coincidence of a corresponding pattern of the first to $2^M$-th patterns; and
    a compensation calculator configured to determine first to $2^M$-th compensation values based on the first pattern stream such that results of multiplying the first to $2^M$-th count values by the first to $2^M$-th compensation values, respectively, are even,
    wherein "N" is a natural number, and "M" is a natural number smaller than "N".

2. The compensation circuit of claim 1,
    wherein the compensation calculator applies, in response to a sum of the first to $2^M$-th count values being less than or equal to an accumulated threshold value, one of a first compensation coefficient and a second compensation coefficient to at least one compensation value of the first to $2^M$-th compensation values,
    wherein the compensation calculator applies, in response to at least one count value among the first to $2^M$-th count values exceeding a compensation threshold value, the first compensation coefficient to at least one compensation value of the first to $2^M$-th compensation values corresponding to the at least one count value exceeding the compensation threshold value, and applies, in response to at least one count value among the first to $2^M$-th count values not exceeding the compensation threshold value, the second compensation coefficient to at least one compensation value of the first to $2^M$-th compensation values corresponding to the at least one count value not exceeding the compensation threshold value, and
    wherein the first compensation coefficient is smaller than the second compensation coefficient.

3. The compensation circuit of claim 1,
    wherein the compensation calculator applies, in response to a sum of the first to $2^M$-th count values exceeding an accumulated threshold value, one of a third compensation coefficient, a fourth compensation coefficient, and a fifth compensation coefficient to at least one compensation value of the first to $2^M$-th compensation values, wherein the compensation calculator applies, in response to at least one count value among the first to $2^M$-th count values exceeding a first reference value, the third compensation coefficient to at least one compensation value of the first to $2^M$-th compensation values corresponding to the at least one count value exceeding the first reference value, wherein the compensation calculator applies, in response to at least one count value among the first to $2^M$-th count values being less than or equal to the first reference value and exceeding a second reference value, the fourth compensation coefficient to at least one compensation value of the first to $2^M$-th compensation values corresponding to the at least one count value less than or equal to the first reference value and exceeding the second reference value, wherein the compensation calculator applies, in response to at least one count value among the first to $2^M$-th count values not exceeding the second reference value, the fifth compensation coefficient to at least one compensation value of the first to $2^M$-th compensation values corresponding to the at least one count value not exceeding the second reference value, wherein the first reference value is greater than the second reference value, and wherein the third compensation coefficient is smaller than the fourth compensation coefficient, and the fourth compensation coefficient is smaller than the fifth compensation coefficient.

4. The compensation circuit of claim 1, further comprising:

a pattern table configured to store the first pattern stream, wherein the data analyzer is further configured to:

receive a second bit stream including (N+1)-th to 2N-th bits, count a number of times of coincidence of each of the first to $2^M$-th patterns from the second bit stream, and to generate a second pattern stream including $(2^M+1)$-th to $2^{M+1}$-th count values, each count value of the $(2^M+1)$-th to $2^{M+1}$-th count values corresponding to a number of times of coincidence of a corresponding pattern of the first to $2^M$-th patterns, wherein the pattern table is further configured to store the second pattern stream and to generate an accumulated pattern stream including first to $2^M$-th accumulated count values based on the first and second pattern streams, and wherein the compensation calculator is further configured to determine $(2^M+1)$-th to $2^{M+1}$-th compensation values based on the accumulated pattern stream.

5. The compensation circuit of claim 4, wherein the compensation calculator applies, in response to a sum of the first to $2^M$-th accumulated count values being less than or equal to an accumulated threshold value, one of a first compensation coefficient and a second compensation coefficient to at least one compensation value of the $(2^M+1)$-th to $2^{M+1}$-th compensation values, wherein the compensation calculator applies, in response to at least one count value exceeding a compensation threshold value, the first compensation coefficient to at least one compensation value of the $(2^M+1)$-th to $2^{M+1}$-th compensation values corresponding to the at least one count value exceeding the compensation threshold value among the $(2^M+1)$-th to $2^{M+1}$-th count values, wherein the compensation calculator applies, in response to at least one count value being less than or equal to the compensation threshold value among the $(2^M+1)$-th to $2^{M+1}$-th count values, the second compensation coefficient to at least one compensation value of the $(2^M+1)$-th to $2^{M+1}$-th compensation values corresponding to the at least one count value less than or equal to the compensation threshold value among the $(2^M+1)$-th to $2^{M+1}$-th count values, and wherein the first compensation coefficient is smaller than the second compensation coefficient.

6. The compensation circuit of claim 4, wherein the compensation calculator applies, in response to a sum of the first to $2^M$-th accumulated count values exceeding an accumulated threshold value, one of a third compensation coefficient, a fourth compensation coefficient, and a fifth compensation coefficient to at least one compensation value of the $(2^M+1)$-th to $2^{M+1}$-th compensation values, wherein the compensation calculator applies, in response to at least one count value, among the $(2^M+1)$-th to $2^{M+1}$-th accumulated count values, exceeding a first reference value, the third compensation coefficient to at least one compensation value of the $(2^M+1)$-th to $2^{M+1}$-th compensation values corresponding to the at least one count value, exceeding the first reference value, among the $(2^M+1)$-th to $2^{M+1}$-th accumulated count values, wherein the compensation calculator applies, in response to at least one count value, being less than or equal to the first reference value and exceeding a second reference value, among the $(2^M+1)$-th to $2^{M+1}$-th accumulated count values, the fourth compensation coefficient to at least one compensation value of the $(2^M+1)$-th to $2^{M+1}$-th compensation values corresponding to the at least one count value, being less than or equal to the first reference value and exceeding the second reference value, among the $(2^M+1)$-th to $2^{M+1}$-th accumulated count values, wherein the compensation calculator applies, in response to at least one count value, not exceeding the second reference value, among the $(2^M+1)$-th to $2^{M+1}$-th accumulated count values, the fifth compensation coefficient to at least one compensation value of the $(2^M+1)$-th to $2^{M+1}$-th compensation values corresponding to the at least one count value, not exceeding the second reference value, among the $(2^M+1)$-th to $2^{M+1}$-th accumulated count values, wherein the first reference value is greater than the second reference value, and wherein the third compensation coefficient is smaller than the fourth compensation coefficient, and the fourth compensation coefficient is smaller than the fifth compensation coefficient.

7. The compensation circuit of claim 4, wherein the pattern table is further configured to:

generate the first to $2^M$-th accumulated count values by adding the first to $2^M$-th count values of the first pattern stream and the $(2^M+1)$-th to $2^{M+1}$-th count values of the second pattern stream, respectively.

8. The compensation circuit of claim 4, wherein the pattern table generates, in response to at least one count value of the first to $2^M$-th count values of the first pattern stream exceeding a scaling reference value, the accumulated pattern stream based on a downscaled first pattern stream and the second pattern stream.

9. The compensation circuit of claim 4,
wherein the pattern table generates, in response to a threshold time after when the first pattern stream is generated, the accumulated pattern stream based on a downscaled first pattern stream and the second pattern stream.

10. The compensation circuit of claim 4,
wherein the data analyzer is further configured to:
update the first to $2^M$-th count values by counting a number of times of coincidence of each of the first to $2^M$-th patterns from an N-th bit of the first bit stream to a most significant bit of a bit stream positioned immediately before the first bit stream.

11. The compensation circuit of claim 1,
wherein each of the first to N-th bits of the first bit stream has a first bit value or a second bit value
wherein the first to N-th bits of the first bit stream correspond to first to N-th analog voltage levels, respectively,
wherein the data analyzer is further configured to determine a dominant cursor based on the first to N-th analog voltage levels, and
wherein the compensation calculator is further configured to determine the first to $2^M$-th compensation values based on the determined dominant cursor.

12. The compensation circuit of claim 11,
wherein, whenever the data analyzer determines the number of times of coincidence of each of the first to $2^M$-th patterns from the first bit stream, the data analyzer is further configured to calculate a ratio indicating whether a bit corresponding to the dominant cursor has a first bit value or a second bit value, and
wherein the compensation calculator is further configured to determine the first to $2^M$-th compensation values such that the calculated ratio is uniform.

13. An equalizer circuit comprising:
a decision feedback equalizer (DFE) configured to receive a received signal from the outside and to output an equalization signal by removing an intersymbol interference (ISI) from the received signal based on DFE coefficients;
a deserializer configured to generate a bit stream including first to N-th bits and an error bit stream including first to N-th bits based on the equalization signal;
a flip-flop configured to adjust an output timing of each of the first to N-th bits of the error bit stream;
a compensation circuit configured to generate a compensation stream including first to $2^M$-th compensation values based on the bit stream; and
a DFE coefficient calculator configured to generate the DFE coefficients based on the compensation stream and the bit stream from the compensation circuit and the error bit stream from the flip-flop and to output the DFE coefficients to the DFE,
wherein the compensation circuit includes:
a data analyzer configured to:
count a number of times of coincidence of each of first to $2^M$-th patterns from the bit stream, a size of each pattern of the first to $2^M$-th patterns being M bits, and
generate a pattern stream including first to $2^M$-th count values, each count value of the first to $2^M$-th count values corresponding to a result of counting a number of times of coincidence of a corresponding pattern of the first to $2^M$-th patterns;
a pattern table configured to store the pattern stream; and
a compensation calculator configured to:
determine the first to $2^M$-th compensation values based on the pattern stream from the data analyzer such that results of multiplying the first to $2^M$-th count values by the first to $2^M$-th compensation values, respectively, are even, and
wherein "N" is a natural number, and "M" is a natural number smaller than "N".

14. The equalizer circuit of claim 13,
wherein the compensation calculator applies, in response to a sum of the first to $2^M$-th count values being less than or equal to an accumulated threshold value, one of a first compensation coefficient and a second compensation coefficient to at least one compensation value of the first to $2^M$-th compensation values,
wherein the compensation calculator applies, in response to at least one count value among the first to $2^M$-th count values exceeding a compensation threshold value, the first compensation coefficient to at least one compensation value of the first to $2^M$-th compensation values corresponding to the at least one count value exceeding the compensation threshold value, and applies, in response to at least one count value among the first to $2^M$-th count values not exceeding the compensation threshold value, the second compensation coefficient to at least one compensation value of the first to $2^M$-th compensation values corresponding to the at least one count value not exceeding the compensation threshold value, and
wherein the first compensation coefficient is smaller than the second compensation coefficient.

15. The equalizer circuit of claim 13,
wherein the compensation calculator applies, in response to a sum of the first to $2^M$-th count values exceeding an accumulated threshold value, one of a third compensation coefficient, a fourth compensation coefficient, and a fifth compensation coefficient to at least one compensation value of the first to $2^M$-th compensation values,
wherein the compensation calculator applies, in response to at least one count value among the first to $2^M$-th count values exceeding a first reference value, the third compensation coefficient to at least one compensation value of the first to $2^M$-th compensation values corresponding to the at least one count value exceeding the first reference value,
wherein the compensation calculator applies, in response to at least one count value among the first to $2^M$-th count values being less than or equal to the first reference value and exceeding a second reference value, the fourth compensation coefficient to at least one compensation value of the first to $2^M$-th compensation values corresponding to the at least one count value being less than or equal to the first reference value and exceeding the second reference value; and
wherein the compensation calculator applies, in response to at least one count value among the first to $2^M$-th count values not exceeding the second reference value, the fifth compensation coefficient to at least one compensation value of the first to $2^M$-th compensation values corresponding to the at least one count value not exceeding the second reference value,
wherein the first reference value is greater than the second reference value, and wherein the third compensation coefficient is smaller than the fourth compensation coefficient, and the fourth compensation coefficient is smaller than the fifth compensation coefficient.

16. The equalizer circuit of claim 13,
wherein the flip-flop is further configured to adjust the output timing of each of the first to N-th bits of the error bit stream such that an output timing of each of the first to N-th bits of the error bit stream is the same as an output timing of each of the first to N-th bits of the bit stream of the compensation circuit.

17. An operating method of a compensation circuit, the method comprising:
receiving a first bit stream including first to N-th bits;
counting a number of times of coincidence of each of first to $2^M$-th patterns from the first bit stream, a size of each pattern of the first to $2^M$-th patterns being M bits;
generating a first pattern stream including first to $2^M$-th count values, each count value of the first to $2^M$-th count values corresponding to a result of counting a number of times of coincidence of a corresponding pattern of the first to $2^M$-th patterns from the first bit stream; and
determining first to $2^M$-th compensation values based on the first pattern stream such that results of multiplying the first to $2^M$-th count values by the first to $2^M$-th compensation values, respectively, are even,
wherein "N" is a natural number, and "M" is a natural number smaller than "N".

18. The method of claim 17,
wherein the determining of the first to $2^M$-th compensation values includes:
determining whether a sum of the first to $2^M$-th count values is less than or equal to an accumulated threshold value; and
applying, in response to the sum of the first to $2^M$-th count values being less than or equal to the accumulated threshold value, one of a first compensation coefficient and a second compensation coefficient to at least one compensation value of the first to $2^M$-th compensation values,
wherein the applying of one of the first compensation coefficient and the second compensation coefficient includes:
applying, in response to at least one count value among the first to $2^M$-th count values exceeding a compensation threshold value, the first compensation coefficient to at least one compensation value of the first to $2^M$-th compensation values corresponding to the at least one count value exceeding the compensation threshold value; and
applying, in response to at least one count value among the first to $2^M$-th count values not exceeding the compensation threshold value, the second compensation coefficient to at least one compensation value of the first to $2^M$-th compensation values corresponding to at least one count value not exceeding the compensation threshold value, and
wherein the first compensation coefficient is smaller than the second compensation coefficient.

19. The method of claim 17,
wherein the determining of the first to $2^M$-th compensation values includes:
determining whether a sum of the first to $2^M$-th count values exceeds an accumulated threshold value; and
applying, in response to the sum of the first to $2^M$-th count values exceeding the accumulated threshold value, one of a third compensation coefficient, a fourth compensation coefficient, and a fifth compensation coefficient to at least one compensation value of the first to $2^M$-th compensation values,
wherein the applying of one of the third compensation coefficient, the fourth compensation coefficient, and the fifth compensation coefficient includes:
applying, in response to at least one count value among the first to $2^M$-th count values exceeding a first reference value, the third compensation coefficient to at least one compensation value of the first to $2^M$-th compensation values corresponding to the at least one count value exceeding the first reference value;
applying, in response to at least one count value among the first to $2^M$-th count values being less than or equal to the first reference value and exceeding a second reference value, the fourth compensation coefficient to at least one compensation value of the first to $2^M$-th compensation values corresponding to at least one count value being less than or equal to the first reference value and exceeding the second reference value; and
applying, in response to at least one count value among the first to $2^M$-th count values being less than or equal to the second reference value, the fifth compensation coefficient to at least one compensation value of the first to $2^M$-th compensation values corresponding to the at least one count value being less than or equal to the second reference value,
wherein the first reference value is greater than the second reference value, and
wherein the third compensation coefficient is smaller than the fourth compensation coefficient, and the fourth compensation coefficient is smaller than the fifth compensation coefficient.

20. The method of claim 17, further comprising:
receiving a second bit stream including (N+1)-th to 2N-th bits;
counting a number of times of coincidence of each of the first to $2^M$-th patterns from the second bit stream;
generating a second pattern stream including $(2^M+1)$-th to $2^{M+1}$-th count values, each count value of the $(2^M+1)$-th to $2^{M+1}$-th count values corresponding to a result of counting a number of times of coincidence of a corresponding pattern of the first to $2^M$-th patterns from the second bit stream; and
generating an accumulated pattern stream including first to $2^M$-th accumulated count values based on the first and second pattern streams; and
determining $(2^M+1)$-th to $2^{M+1}$-th compensation values based on the accumulated pattern stream.

* * * * *